(12) United States Patent
Hayashi et al.

(10) Patent No.: US 11,803,257 B2
(45) Date of Patent: Oct. 31, 2023

(54) INPUT SUPPORT DEVICE AND INPUT DETECTION SYSTEM

(71) Applicant: Japan Display Inc., Tokyo (JP)

(72) Inventors: Makoto Hayashi, Tokyo (JP); Yuto Kakinoki, Tokyo (JP); Takaaki Kono, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/516,128

(22) Filed: Nov. 1, 2021

(65) Prior Publication Data

US 2022/0137722 A1    May 5, 2022

(30) Foreign Application Priority Data

Nov. 2, 2020 (JP) .................................. 2020-183719
May 11, 2021 (JP) .................................. 2021-080370

(51) Int. Cl.
| | |
|---|---|
| *G06F 3/038* | (2013.01) |
| *H03K 17/96* | (2006.01) |
| *G06F 3/044* | (2006.01) |
| *G06F 3/039* | (2013.01) |
| *G06F 3/0362* | (2013.01) |
| *G06F 3/02* | (2006.01) |

(52) U.S. Cl.
CPC ............ *G06F 3/038* (2013.01); *G06F 3/0362* (2013.01); *G06F 3/0393* (2019.05); *G06F 3/0446* (2019.05); *H03K 17/96* (2013.01); *G06F 3/0202* (2013.01); *G06F 3/0443* (2019.05); *G06F 2203/04111* (2013.01)

(58) Field of Classification Search
CPC combination set(s) only.
See application file for complete search history.

(56) References Cited

U.S. PATENT DOCUMENTS

| | | | |
|---|---|---|---|
| 9,477,859 B2* | 10/2016 | Lefevre | G06K 7/10039 |
| 2005/0083318 A1* | 4/2005 | Rix | H01H 13/705 |
| | | | 345/179 |
| 2006/0256090 A1* | 11/2006 | Huppi | G06F 1/1616 |
| | | | 345/173 |
| 2008/0149401 A1* | 6/2008 | Hagen | G06F 3/0441 |
| | | | 178/18.08 |
| 2016/0154528 A1* | 6/2016 | Ahn | G06F 3/0441 |
| | | | 345/174 |
| 2016/0170543 A1* | 6/2016 | Kawamura | G06F 3/0447 |
| | | | 345/174 |
| 2017/0336897 A1* | 11/2017 | Zachut | G06F 3/046 |
| 2020/0073487 A1* | 3/2020 | Ballan | G06F 3/0362 |
| 2020/0301547 A1 | 9/2020 | Mori et al. | |
| 2021/0232269 A1 | 7/2021 | Sasaki et al. | |

FOREIGN PATENT DOCUMENTS

| | | | |
|---|---|---|---|
| JP | 6342105 B1 | 6/2018 | |
| JP | 6532631 B1 | 6/2019 | |

* cited by examiner

*Primary Examiner* — William Boddie
*Assistant Examiner* — Alecia D English
(74) *Attorney, Agent, or Firm* — K&L Gates LLP

(57) ABSTRACT

An input support device arranged above a detection device including a plurality of electrodes, the input support device comprising: an LC circuit; a first electrode coupled to one end side of the LC circuit; a second electrode coupled to another end side of the LC circuit, and an adjustment circuit coupled to the LC circuit and configured to adjust circuit characteristics of the LC circuit.

7 Claims, 20 Drawing Sheets

INPUT SUPPORT DEVICE AND INPUT DETECTION SYSTEM

CROSS-REFERENCE TO RELATED APPLICATION

This application claims the benefit of priority from Japanese Patent Application No. 2020-183719 filed on Nov. 2, 2020 and Japanese Patent Application No. 2021-080370 filed on May 11, 2021, the entire contents of which are incorporated herein by reference.

BACKGROUND

1. Technical Field

The present invention relates to an input support device and an input detection system.

2. Description of the Related Art

Japanese Patent Nos. 6342105 and 6532631 describe an input support device that is placed on a touch panel configured to detect change in electrostatic capacitance or change in a contact region and supports input operations through the touch panel (referred to as an operation knob or a knob in Japanese Patent Nos. 6342105 and 6532631). As a method for detecting the input support device, a method in which the input support device is detected using resonance of a resonance circuit provided in the input support device has been known.

In the above-mentioned input support device, circuit characteristics such as a resonant frequency of the resonance circuit and a signal intensity (amplitude) that is output from the input support device are required to be appropriately controlled.

SUMMARY

An input support device according to an embodiment of the present disclosure arranged above a detection device including a plurality of electrodes is disclosed. The input support device includes an LC circuit, a first electrode coupled to one end side of the LC circuit, a second electrode coupled to another end side of the LC circuit, and an adjustment circuit coupled to the LC circuit and configured to adjust circuit characteristics of the LC circuit.

An input detection system according to an embodiment of the present disclosure includes the input support device, a detection device including a plurality of electrodes, a cover member provided above the detection device, and a ferromagnetic member facing the cover member with the detection device interposed. The input support device includes a support body provided above the cover member and a rotating body provided on the support body in a rotatable manner, and a magnet is provided in the support body of the input support device.

An input detection system according to an embodiment of the present disclosure includes the input support device, a detection device including a plurality of electrodes, a cover member provided above the detection device, and an adhesive sheet provided above the cover member. The input support device includes a support body fixed above the adhesive sheet and a rotating body provided on the support body in a rotatable manner.

DETAILED DESCRIPTION

Figure 1:
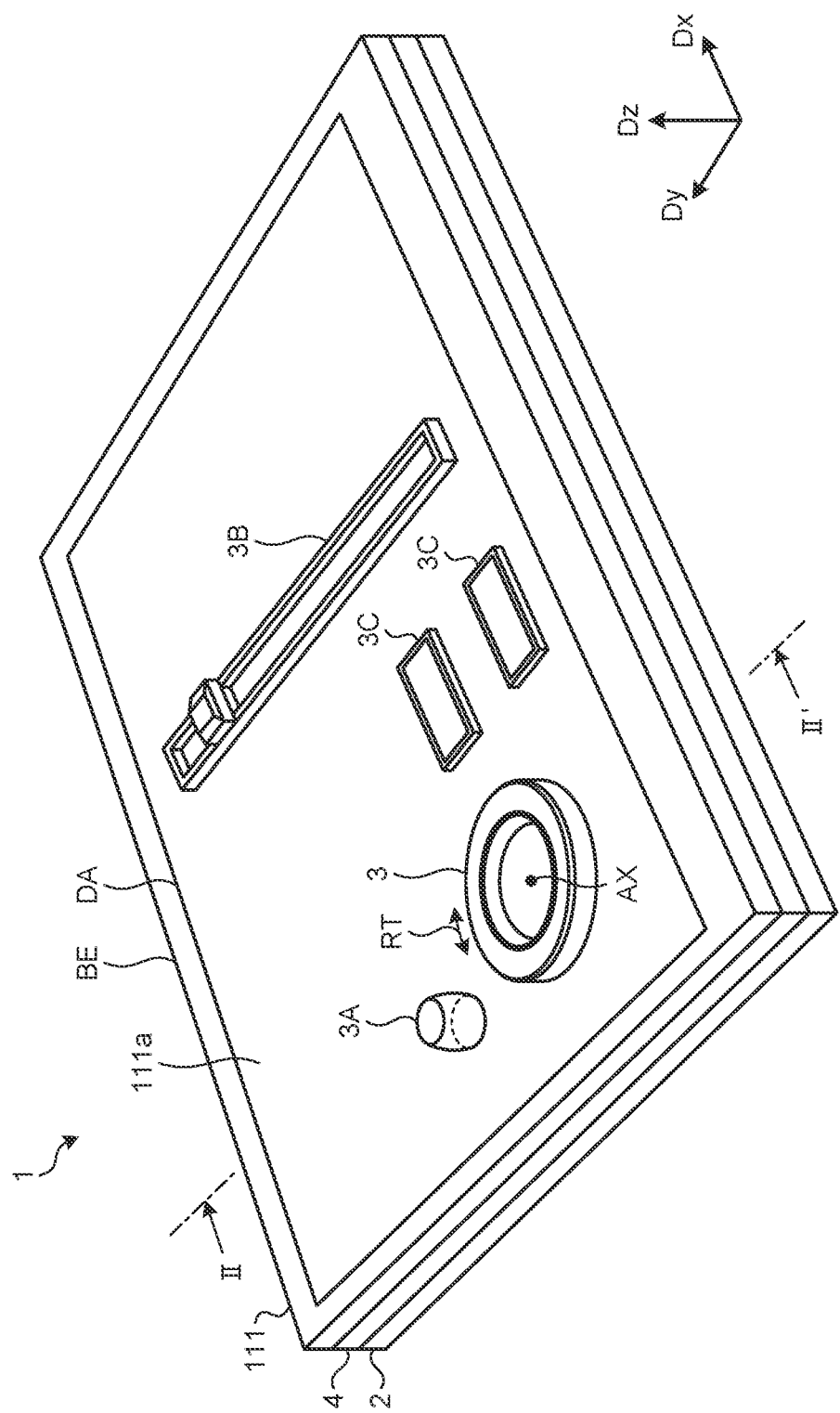
FIG. 1 is a perspective view schematically illustrating an input detection system according to a first embodiment.

Aspects for carrying out the present invention (embodiments) will be described in detail with reference to the drawings. Contents described in the following embodiments do not limit the present disclosure. Components described below include those that can be easily assumed by those skilled in the art and substantially the same components. Furthermore, the components described below can be appropriately combined. What is disclosed herein is merely an example, and appropriate modifications within the gist of the disclosure of which those skilled in the art can easily think are naturally encompassed in the scope of the present disclosure. In the drawings, widths, thicknesses, shapes, and the like of the components can be schematically illustrated in comparison with actual aspects for more clear explanation. They are however merely examples and do not limit interpretation of the present disclosure. In the present disclosure and the drawings, the same reference numerals denote components similar to those described before with reference to the drawing that has been already referred, and detail explanation thereof can be appropriately omitted.

In the present specification and the scope of the invention, when an aspect in which a second structure is arranged above a first structure is represented, simple expression "above" includes both of the case in which the second structure is arranged just above the first structure and the case in which the second structure is arranged above the first structure with a third structure interposed therebetween unless otherwise specified.

First Embodiment

FIG. 1 is a perspective view schematically illustrating an input detection system according to a first embodiment. As illustrated in FIG. 1, an input detection system 1 includes a display device 2, a detection device 4, a cover member 111, and an input support device (input device) 3. The display device 2, the detection device 4, and the cover member 111 are stacked in this order in a third direction Dz.

One direction of a plane (upper surface 111a) of the cover member 111 is a first direction Dx, and a direction orthogonal to the first direction Dx is a second direction Dy. The second direction Dy is not limited to be orthogonal to the first direction Dx and may intersect with the first direction Dx at an angle other than 90°. A third direction Dz orthogonal to the first direction Dx and the second direction Dy corresponds to the thickness direction of the cover member 111.

The display device 2 is, for example, a liquid crystal display (LCD). The display device 2 is however not limited thereto and may be an organic electroluminescent (EL) display panel (organic light emitting diode (OLED)) or an inorganic EL display (a micro LED or a mini LED), for example. Alternatively, the display device 2 may be an electrophoretic display (EPD) using an electrophoretic element as a display element.

The detection device 4 is a what-is-called touch panel mounted on the display device 2. The detection device 4 is a mutual electrostatic capacitance-type touch panel including drive electrodes Tx and detection electrodes Rx (refer to FIG. 3). The detection device 4 is however not limited thereto and may be a self-electrostatic capacitance-type touch panel in which a plurality of detection electrodes are arrayed in a matrix with a row-column configuration.

As illustrated in FIG. 1, a peripheral region BE is provided on the outer side of a detection region DA in the detection device 4. The detection region DA is formed to have a square shape but the outer shape of the detection region DA is not limited thereto. For example, the detection region DA may have a substantially square shape with curved corners or may have a cutout. Alternatively, the detection region DA may have another polygonal shape or another shape such as a circular shape and an elliptic shape.

The detection region DA is a region in which the drive electrodes Tx and the detection electrodes Rx (refer to FIG. 3) are provided. The peripheral region BE indicates a region on the inner side of the outer periphery of the detection device 4 and on the outer side of the detection region DA. The peripheral region BE may have a frame shape surrounding the detection region DA, and in this case, the peripheral region BE can also be referred to as a frame region. The detection region DA is arranged so as to overlap with a display region of the display device 2.

As illustrated in FIG. 1, the input support device 3 is arranged (mounted) on the upper surface 111a of the cover member 111 for use. A user can perform an input operation on the detection device 4 by operating the input support device 3 arranged above the detection device 4. The input support device 3 is, for example, a rotary knob and has an annular shape in a plan view when seen from the upper surface 111a of the cover member 111. The detection device 4 can detect a position of the input support device 3 in a plane and a rotation operation RT centered on a rotating axis AX.

FIG. 1 illustrates a plurality of input support devices 3A, 3B, and 3C as other examples of the input support device 3. The input support device 3A is a rotary knob and is formed into a tab shape having no through-hole unlike the input support device 3. The input support device 3B is a slider, and an input operation can be performed by displacement of a tab thereof in a plane. The input support device 3B has a bar-like shape in a plan view. The input support device 3C is a button or an input key, and an input operation can be performed by touching the input support device 3C or performing a press-in operation thereon. The input detection system 1 is not limited to have the configuration in which all of the input support devices 3, 3A, 3B, and 3C are mounted, and it is sufficient that at least equal to or more than one of the input support devices 3, 3A, 3B, and 3C is provided. Hereinafter, the input support device 3 is described. Explanation of the input support device 3 can be applied also to the other input support devices 3A, 3B, and 3C.

Figure 2:
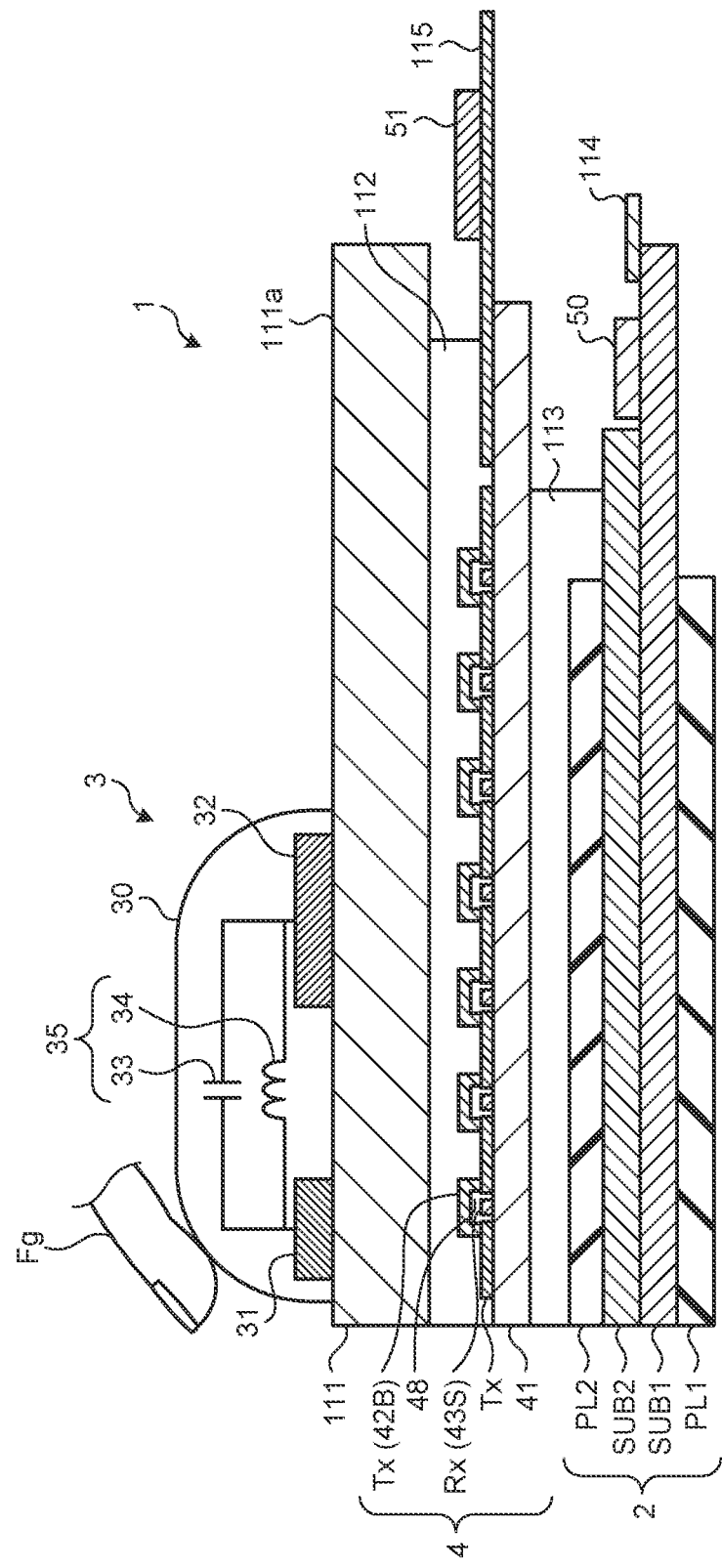
FIG. 2 is a cross-sectional view cut along line II-II' in FIG. 1.

FIG. 2 is a cross-sectional view cut along line II-II' in FIG. 1. As illustrated in FIG. 2, the display device 2 includes an array substrate SUB1, a counter substrate SUB2, a first polarizing plate PL1, and a second polarizing plate PL2. The first polarizing plate PL1, the array substrate SUB1, the counter substrate SUB2, and the second polarizing plate PL2 are stacked in this order in the third direction Dz.

In the present specification, the direction toward the cover member 111 from the display device 2 in the direction perpendicular to the upper surface 111a of the cover member 111 is an "upper-side" or simply an "above". The direction toward the display device 2 from the cover member 111 is a "lower-side" or simply a "under". The expression "plan view" indicates a positional relation when seen from the direction perpendicular to the upper surface 111a of the cover member 111.

The array substrate SUB1 is a drive circuit substrate for driving a plurality of pixels. The counter substrate SUB2 is provided so as to face the array substrate SUB1. A liquid crystal layer as a display function layer is provided between the array substrate SUB1 and the counter substrate SUB2.

A display integrated circuit (IC) 50 and a wiring substrate 114 are coupled to a protruding portion of the array substrate SUB1. The display IC 50 includes a control circuit and the like that controls display of the display device 2. The display IC 50 is not limited to this example and may be mounted on the wiring substrate 114. Arrangement of the display IC 50 is not limited thereto, and the display IC 50 may be provided on a control substrate or a flexible substrate outside the module, for example. The wiring substrate 114 is configured by a flexible printed circuits (FPC), for example. The wiring substrate 114 is coupled to a plurality of terminals of the array substrate SUB1.

The detection device 4 is bonded above the display device 2 with an adhesive layer 113 interposed therebetween. The detection device 4 includes a substrate 41, the drive electrodes Tx, the detection electrodes Rx, and an insulating film 48. FIG. 2 illustrates a part (coupling portions 43S) of the detection electrodes Rx. The drive electrodes Tx and the detection electrodes Rx are provided above the substrate 41. Bridge portions 42B of the drive electrodes Tx and the coupling portions 43S of the detection electrodes Rx are insulated from each other with the insulating film 48. Mutual electrostatic capacitances Cm (refer to FIG. 5) are formed between the drive electrodes Tx and the detection electrodes Rx.

A wiring substrate 115 is coupled to the substrate 41. The wiring substrate 115 is configured by a flexible printed circuits, for example. A detection IC 51 is mounted on the wiring substrate 115. The detection IC 51 includes a detection circuit 55 (refer to FIG. 3) and receives supply of detection signals Vdet from the detection electrodes Rx. The detection IC 51 can detect a detection target such as a finger Fg and the input support device 3 based on the detection signals Vdet. Arrangement of the detection IC 51 is not limited thereto, and the detection IC 51 may be provided on a control substrate or a flexible substrate outside the module, for example.

The cover member 111 is bonded above the detection device 4 with an adhesive layer 112 interposed therebetween. The cover member 111 is formed by, for example, a glass substrate or a resin substrate.

As illustrated in FIG. 2, the input support device 3 includes a housing 30, a first electrode 31, a second electrode 32, and an LC circuit 35. The housing 30 is made of, for example, an insulating resin material and is a hollow member in which a space is provided. The first electrode 31, the second electrode 32, and the LC circuit 35 are provided in the housing 30. The LC circuit 35 configures an LC resonance circuit in which a capacitor 33 and an inductor 34 are coupled in parallel with each other. The first electrode 31 is coupled to one end side of the LC circuit 35 (coupling portions of the capacitor 33 and the inductor 34 on one end side). The second electrode 32 is coupled to the other end side of the LC circuit 35 (coupling portions of the capacitor 33 and the inductor 34 on the other end side). The display device 2 can detect positions of the first electrode 31 and the second electrode 32 using LC resonance of the LC circuit 35.

FIG. 2 omits illustration of an adjustment circuit 38 (refer to FIG. 5) of the input support device 3 for making the drawing easy to view. The detail coupling configuration of the input support device 3 will be described later. In the following explanation, the housing 30 has a circular shape in a plan view with no through-hole in order to schematically illustrate the LC circuit 35. The shape of the housing 30 can however be appropriately changed and may have an annular shape with a through-hole formed in a region overlapping with the rotating axis AX as illustrated in FIG. 1.

Figure 3:
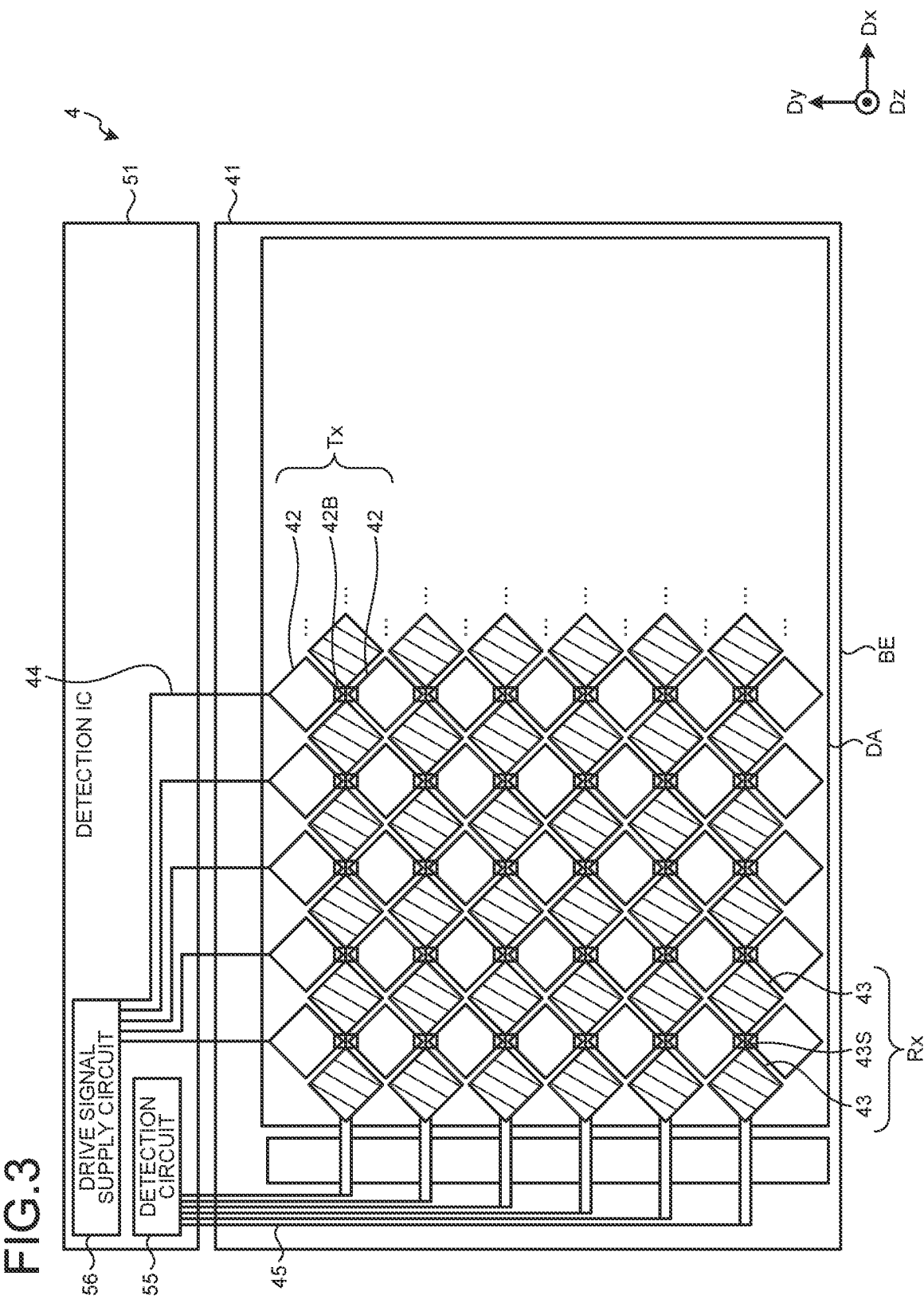
FIG. 3 is a plan view schematically illustrating a detection device.

FIG. 3 is a plan view schematically illustrating the detection device. FIG. 3 illustrates electrode portions 43 of the detection electrodes Rx by hatching for making the drawing easy to view. As illustrated in FIG. 3, the drive electrodes Tx and the detection electrodes Rx are provided in the detection region DA of the substrate 41. The drive electrodes Tx and the detection electrodes Rx are made of, for example, a conductive material having a light transmitting property, such as indium tin oxide (ITO) and indium zinc oxide (IZO).

The drive electrodes Tx include electrode portions 42 and the bridge portions 42B. The electrode portions 42 are aligned in the second direction Dy in one drive electrode Tx. The bridge portions 42B couple the electrode portions 42 adjacent to each other in the second direction Dy. One drive electrode Tx thereby extends in the second direction Dy. The drive electrodes Tx are aligned in the first direction Dx. The drive electrodes Tx are coupled to the detection IC 51 through respective coupling wiring lines 44.

The detection electrodes Rx include the electrode portions 43 and the coupling portions 43S. The electrode portions 43 are aligned in the first direction Dx in one detection electrode Rx. The coupling portions 43S couple the electrode portions 43 adjacent in the first direction Dx. One detection electrode Rx thereby extends in the first direction Dx. The detection electrodes Rx are aligned in the second direction Dy. The detection electrodes Rx are coupled to the detection IC 51 through respective coupling wiring lines 45. In the present embodiment, the electrode portions 43 of the detection electrodes Rx are provided in the same layer as a layer in which the electrode portions 42 of the drive electrodes Tx are provided. The bridge portions 42B are provided, with the insulating film 48 interposed therebetween, in a layer differing from a layer in which the coupling portions 43S are provided and intersect with the coupling portions 43S in a plan view.

The detection IC 51 includes the detection circuit 55 and a drive signal supply circuit 56. The drive signal supply circuit 56 supplies a detection drive signal VD to each of the drive electrodes Tx. The detection electrodes Rx output the detection signals Vdet based on change in the mutual electrostatic capacitances Cm when the detection drive signal VD is supplied. The detection circuit 55 can detect the detection target based on the detection signals Vdet that are output in accordance with the change in the mutual electrostatic capacitances Cm between the drive electrodes Tx and the detection electrodes Rx.

To be specific, in touch detection of detecting a position of the finger Fg, the detection IC 51 (drive signal supply circuit 56) supplies the detection drive signal VD to the drive electrodes Tx, and the detection signals Vdet based on change in the mutual electrostatic capacitances are output to the detection IC 51. The detection IC 51 thereby detects contact or proximity of the finger Fg.

In input support device detection of detecting the input support device 3, the detection IC 51 (drive signal supply circuit 56) supplies the detection drive signal VD to the drive electrodes Tx, and the detection IC 51 detects a position and the like of the input support device 3 utilizing the change in the mutual electrostatic capacitances and the resonance of the LC circuit 35 included in the input support device 3.

Although FIG. 3 illustrates only some drive electrodes Tx and some detection electrodes Rx in order to make the drawing easy to view, the drive electrodes Tx and the detection electrodes Rx are arranged on the entire detection region DA. The electrode portions 42 of the drive electrodes Tx and the electrode portions 43 of the detection electrodes Rx have square shapes (diamond shapes). The shapes thereof are however not limited thereto, and the electrode portions 42 and 43 may have another shapes such as polygonal shapes and circular shapes. The drive electrodes Tx and the detection electrodes Rx are not limited to have the configurations including the electrode portions 42 and 43 and may be formed with electrode patterns extending in predetermined directions, such as rectangular shapes.

Figure 4:
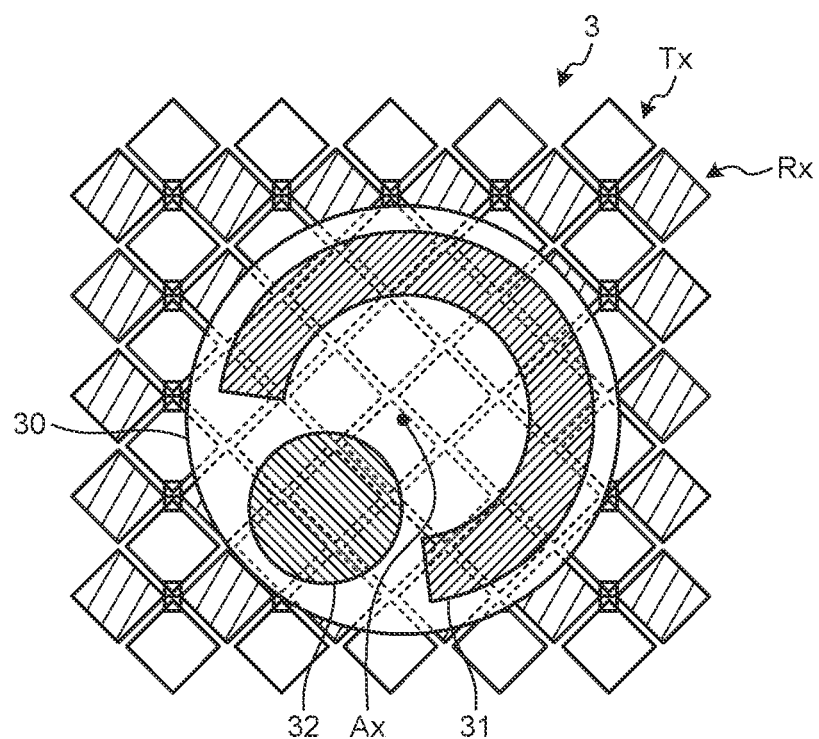
FIG. 4 is a plan view schematically illustrating an input support device.

Next, a method for detecting the input support device 3 will be described with reference to FIG. 4 to FIG. 9. FIG. 4 is a plan view schematically illustrating the input support device. FIG. 4 schematically illustrates the cross-sectional view by cutting the input support device 3 along a plane parallel with the upper surface 111a (refer to FIG. 1). The input support device 3 (housing 30) has a circular shape in a plan view as illustrated in FIG. 4. The first electrode 31 and the second electrode 32 are arranged on the opposite sides with respect to the rotating axis AX in a plan view.

The first electrode 31 and the second electrode 32 have different shapes and areas in a plan view. The first electrode 31 has a curved shape curved in a circular arc form along the inner circumferential of the housing 30. The second electrode 32 has a circular shape in a plan view. The second electrode 32 is arranged between one end side and the other end side of the first electrode 31 along the circular arc form. The first electrode 31 has a larger area than that of the second electrode 32. The first electrode 31 and the second electrode 32 are different from each other in the number of overlapped drive electrodes Tx. In the example illustrated in FIG. 4, the first electrode 31 is arranged so as to overlap with four drive electrodes Tx, and the second electrode 32 is arranged so as to overlap with two drive electrodes Tx.

The first electrode 31 and the second electrode 32 are however not limited thereto and may have another shapes such as square shapes and polygonal shapes. The first electrode 31 and the second electrode 32 may have the same shape and area.

Figure 5:
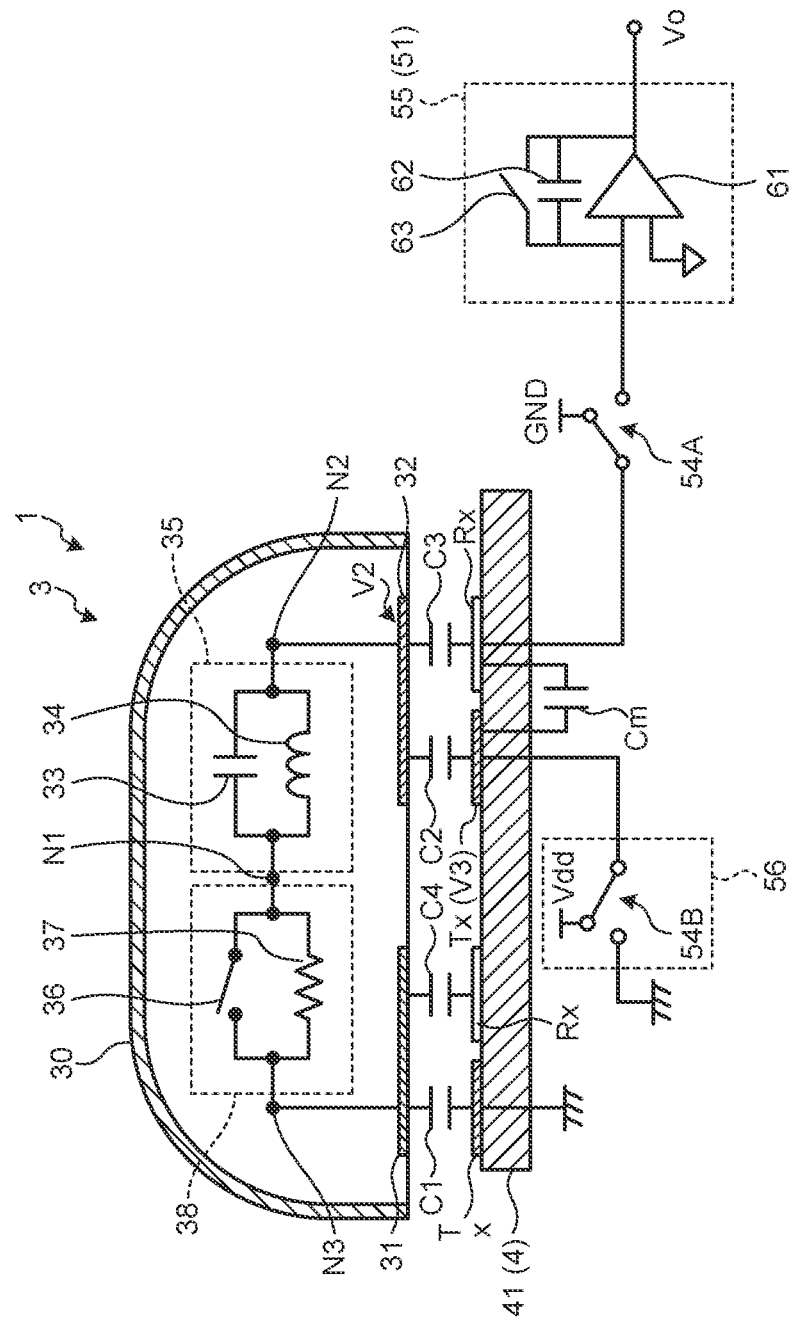
FIG. 5 is a descriptive view for explaining a method for detecting the input support device.
Figure 6:
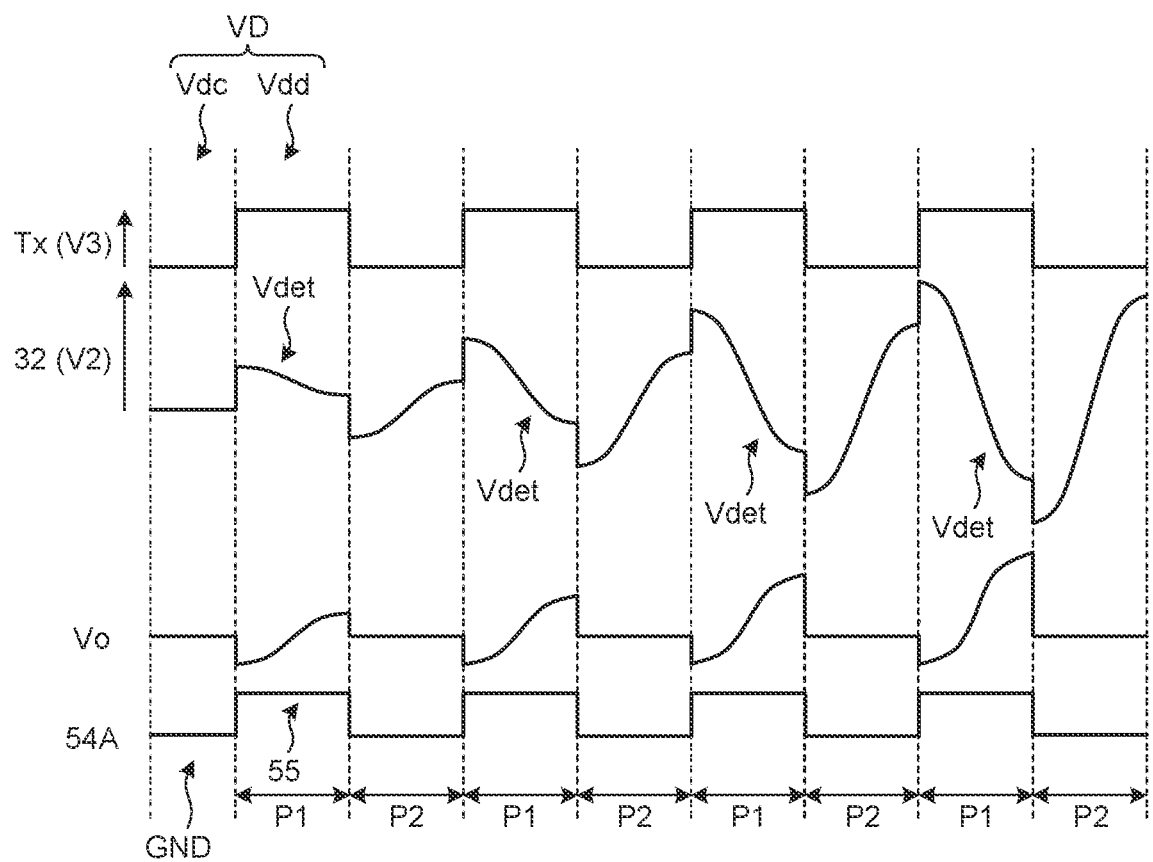
FIG. 6 is a timing waveform chart for explaining the method for detecting the input support device.

FIG. 5 is a descriptive view for explaining the method for detecting the input support device. FIG. 6 is a timing waveform chart for explaining the method for detecting the input support device. As illustrated in FIG. 5, the input support device 3 includes the adjustment circuit 38 in addition to the housing 30, the first electrode 31, the second electrode 32, and the LC circuit 35 described above. The adjustment circuit 38 is a circuit coupled to the LC circuit 35 and adjusts circuit characteristics (for example, a resonant frequency fr and the amplitude of an output signal Vo) of the LC circuit 35.

The adjustment circuit 38 is provided between a coupling portion N1 of the LC circuit 35 on one end side and the first electrode 31. In other words, a coupling portion N3 of the adjustment circuit 38 on one end side is coupled to the first electrode 31. The other end side of the adjustment circuit 38 is coupled to the coupling portion N1 of the LC circuit 35 on one end side. A coupling portion N2 of the LC circuit 35 on the other end side is coupled to the second electrode 32. The adjustment circuit 38 is not limited thereto and may be provided between the coupling portion N2 of the LC circuit 35 on the other end side and the second electrode 32.

The adjustment circuit 38 includes a resistor element 37 coupled to the LC circuit 35 and a switch element 36 coupled in parallel to the resistor element 37. To be specific, one end side of the resistor element 37 and one end side of the switch element 36 are coupled to the coupling portion N3. The other end side of the resistor element 37 and the other end side of the switch element 36 are coupled to the coupling portion N1.

The adjustment circuit 38 can switch a coupling state between the LC circuit 35 and the resistor element 37 by switching ON and OFF of the switch element 36. When the switch element 36 is in an ON state, for example, one end side and the other end side of the resistor element 37 are short-circuited, and the coupling portion N1 of the LC circuit 35 on one end side is coupled to the first electrode 31 without going through the resistor element 37. When the switch element 36 is in an OFF state, the coupling portion N1 of the LC circuit 35 on one end side is coupled to the first electrode 31 through the resistor element 37.

Although a desired configuration of the switch element 36 may be employed, for example, a push-in switch or a slide switch can be employed. The push-in switch enables the coupling state of the resistor element 37 to be switched by pushing in the push-in switch (button) provided on the surface of the housing 30. The slide switch enables the coupling state of the resistor element 37 to be switched by moving a nob (slider) provided on the surface of the housing 30.

Although FIG. 5 equivalently illustrates the capacitor 33 and the inductor 34 configuring the LC circuit 35, and the resistor element 37 and the switch element 36 configuring the adjustment circuit 38, for example, the LC circuit 35 and the adjustment circuit 38 may be formed by chip components mounted on a substrate. It is sufficient that the LC circuit 35 and the adjustment circuit 38 are coupled electrically in series between the first electrode 31 and the second electrode 32, and arrangement thereof in the housing 30 may be desirably set. The LC circuit 35 and the adjustment circuit 38 may be formed as one circuit (chip component) or may be individually formed as a plurality of circuits (chip components).

As illustrated in FIG. 5, each of the first electrode 31 and the second electrode 32 of the input support device 3 is arranged so as to face the drive electrode Tx and/or the detection electrode Rx of the detection device 4.

A capacitance C1 is formed between the first electrode 31 and one drive electrode Tx. One drive electrode Tx is coupled to a reference potential (for example, a reference potential Vdc). A capacitance C2 is formed between the second electrode 32 and the other drive electrode Tx. The other drive electrode Tx is coupled to a power supply potential Vdd or the reference potential (for example, the reference potential Vdc) through a switch element 54B.

A capacitance C3 is formed between the second electrode 32 and the detection electrode Rx. The detection electrode Rx is coupled to the detection circuit 55 or a reference potential (for example, a ground potential GND) through a switch element 54A. The mutual electrostatic capacitance Cm is formed between the drive electrode Tx and the detection electrode Rx. A capacitance C4 is formed between the first electrode 31 and the detection electrode Rx.

The detection circuit 55 is a signal processing circuit provided in the detection IC 51 and is a circuit that receives the detection signals Vdet (refer to FIG. 6) output from the detection electrodes Rx and performs predetermined signal processing thereon to output an output signal Vo. The detection circuit 55 includes a detection signal amplifier 61, a capacitive element 62, and a reset switch 63. The detection circuit 55 is not limited thereto and may further include an A/D conversion circuit (not illustrated) that converts an analog signal output from the detection signal amplifier 61 into a digital signal, for example.

As illustrated in FIG. 5 and FIG. 6, the detection drive signal VD with AC rectangular waves is supplied to the other drive electrode Tx by an operation of the switch element 54B. As the detection drive signal VD, the power supply potential Vdd at a high level potential and the reference potential Vdc at a low level potential are alternately applied repeatedly at a predetermined frequency. A potential V3 of the other drive electrode Tx varies in accordance with the detection drive signal VD. Periods that are repeated in synchronization with the detection drive signal VD are a first period P1 and a second period P2. The first period P1 is a period in which the other drive electrode Tx is coupled to the power supply potential Vdd. The second period P2 in a period in which the other drive electrode Tx is coupled to the reference potential Vdc. The power supply potential Vdd is higher than the reference potential Vdc, for example.

The detection electrode Rx outputs the detection signals Vdet based on the mutual electrostatic capacitance Cm. To be specific, one drive electrode Tx is coupled to the reference potential (for example, the reference potential Vdc), as described above. Signals at different potentials are thereby supplied to the first electrode 31 and the second electrode 32 in the first period P1. The detection electrode Rx is coupled to the detection circuit 55 with a switching operation of the switch element 54A in the first period P1. With this configuration, variation in a potential V2 based on the mutual electrostatic capacitance Cm is output, as the detection signals Vdet, to the detection circuit 55 from the detection electrode Rx.

The detection signal amplifier 61 of the detection circuit 55 amplifies the detection signals Vdet supplied from the detection electrode Rx. A reference voltage having a fixed potential is input to a non-inverting input portion of the detection signal amplifier 61, and the detection electrode Rx is coupled to an inverting input terminal. A signal that is the same as that to one drive electrode Tx is input as the reference voltage in the present embodiment. The detection circuit 55 can reset charges of the capacitive element 62 by turning the reset switch 63 ON.

The detection drive signal VD has the same frequency as the resonant frequency fr of the LC circuit 35. Therefore, the second electrode 32 overlapping with the other drive electrode Tx is also driven at the resonant frequency fr, so that resonance of the LC circuit 35 is generated. With this configuration, the amplitudes of the detection signals Vdet are increased as the first period P1 and the second period P2 are repeated. As illustrated in FIG. 6, the amplitudes of the detection signals Vdet are increased and the potential of the output signal Vo from the detection circuit 55 varies to be increased as the first period P1 is repeated a plurality of number of times.

On the other hand, when the detection target such as the finger Fg different from the input support device 3 comes into contact with or close to the upper surface 111a (refer to FIG. 1), the detection signals Vdet vary in accordance with the change in the mutual electrostatic capacitance Cm. That is to say, since no resonance is generated in the case of the finger Fg or the like, change in the amplitudes of the detection signals Vdet over time as illustrated in FIG. 6 does not occur. The input detection system 1 can thus determine whether the detection target is the finger Fg or the input support device 3 using the LC resonance of the LC circuit 35.

Figure 7:
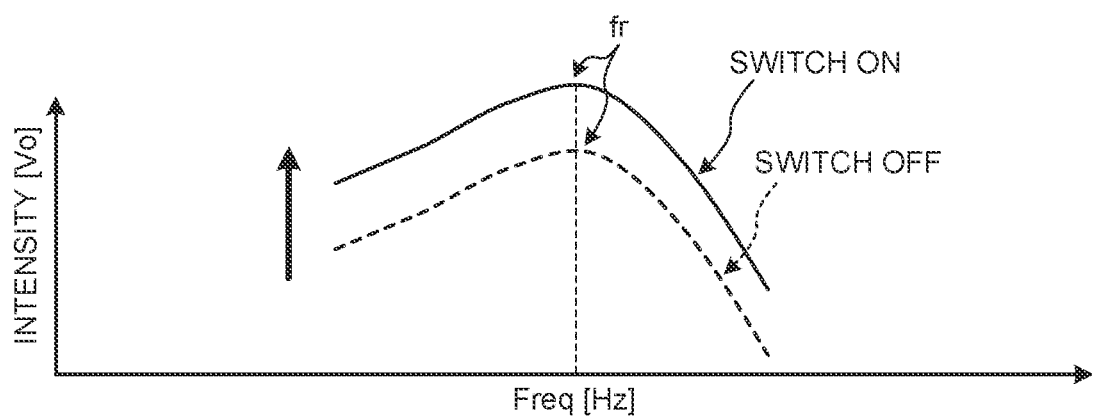
FIG. 7 is a graph schematically illustrating a relation between a signal intensity of an output signal and a frequency of a detection drive signal.
Figure 8:
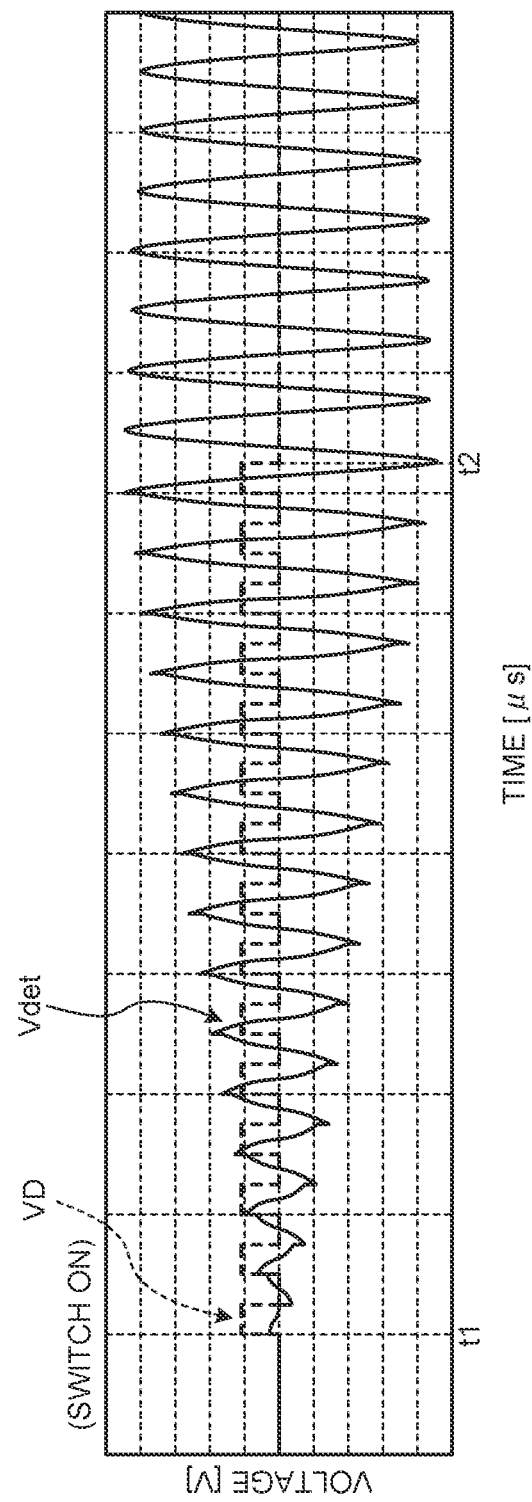
FIG. 8 is a graph schematically illustrating a relation between the detection drive signal and a detection signal when a switch element is in an ON state.
Figure 9:
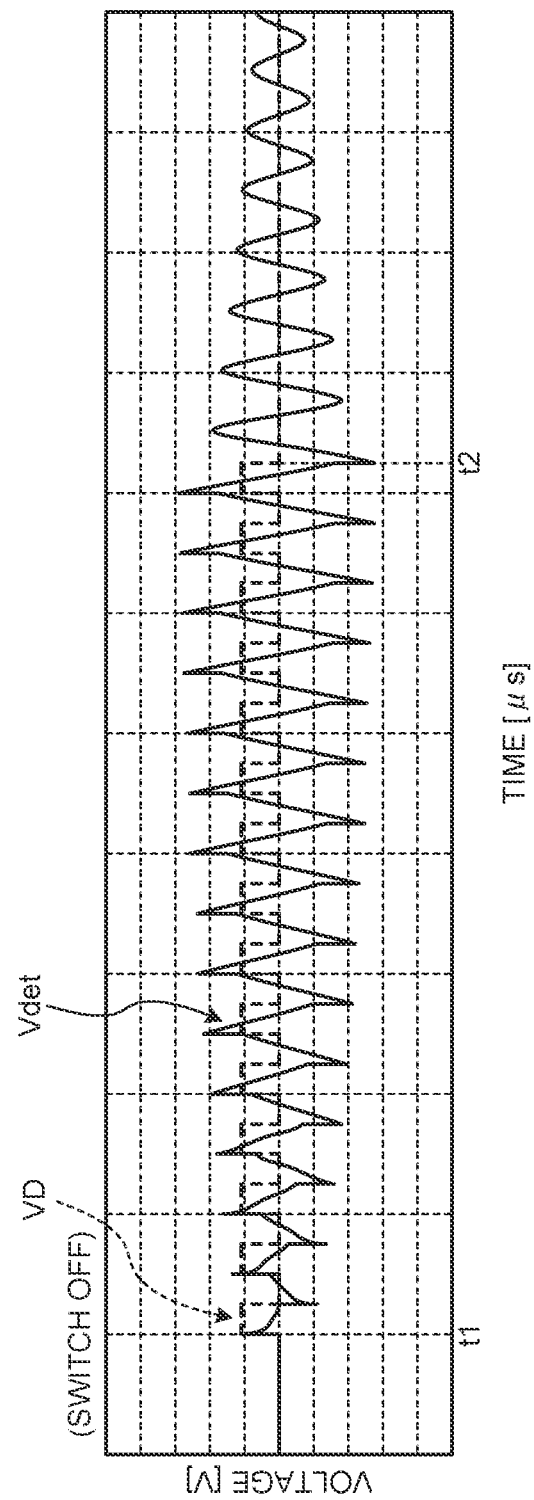
FIG. 9 is a graph schematically illustrating a relation between the detection drive signal and the detection signal when the switch element is in an OFF state.

FIG. 7 is a graph schematically illustrating a relation between a signal intensity of the output signal and the frequency of the detection drive signal. FIG. 8 is a graph schematically illustrating a relation between the detection drive signal and the detection signal when the switch element is in the ON state. FIG. 9 is a graph schematically illustrating the relation between the detection drive signal and the detection signal when the switch element is in the OFF state.

In FIG. 7, the horizontal axis indicates the frequency of the detection drive signal VD and the vertical axis indicates the signal intensity of the output signal Vo. In FIG. 8 and FIG. 9, the horizontal axis indicates time and the vertical axis indicates a voltage.

As illustrated in FIG. 7, the signal intensity (amplitude) of the output signal Vo is different between the case in which the switch element 36 of the adjustment circuit 38 is in the ON state (that is, the case in which the coupling portion N1 of the LC circuit 35 on one end side is coupled to the first electrode 31 without going through the resistor element 37) and the case in which the switch element 36 is in the OFF state (that is, the case in which the coupling portion N1 of the LC circuit 35 on one end side is coupled to the first electrode 31 through the resistor element 37). The signal intensity (amplitude) of the output signal Vo when the switch element 36 is in the ON state is higher than the signal intensity (amplitude) of the output signal Vo when the switch element 36 is in the OFF state. The resonant frequency fr does not vary between the case in which the switch element 36 is in the ON state and the case in which the switch element 36 is in the OFF state.

As illustrated in FIG. 8 and FIG. 9, supply of the detection drive signal VD is started at time t1, and supply of the detection drive signal VD is finished at time t2. In both of the case in which the switch element 36 is in the ON state (refer to FIG. 8) and the case in which the switch element 36 is in the OFF state (refer to FIG. 9), the detection signal Vdet that is output from the second electrode 32 has a frequency in synchronization with the detection drive signal VD. Variation in the amplitude of the detection signal Vdet when the switch element 36 is in the ON state (refer to FIG. 8) is larger than variation in the amplitude of the detection signal Vdet when the switch element 36 is in the OFF state (refer to FIG. 9).

As illustrated in FIG. 8 and FIG. 9, even in a period where no detection drive signal VD is supplied after time t2, the detection signal Vdet is output from the second electrode 32 by resonance of the LC circuit 35, and the amplitude of the detection signal Vdet is gradually decreased with elapse of time.

As described above, the input support device 3 in the present embodiment is arranged above the detection device 4 including the electrodes (the drive electrodes Tx and the detection electrodes Rx) and includes the LC circuit 35, the first electrode 31 coupled to one end side of the LC circuit 35, the second electrode 32 coupled to the other end side of the LC circuit 35, and the adjustment circuit 38 provided at least one of a position between the LC circuit 35 and the first electrode 31 and a position between the LC circuit 35 and the second electrode 32 and configured to adjust the circuit characteristics of the LC circuit 35.

With this configuration, the input support device 3 can adjust the circuit characteristics (the resonant frequency fr and the signal intensity of the output signal Vo) of the LC circuit 35 by the adjustment circuit 38. In the present embodiment, the adjustment circuit 38 can change the coupling state between the LC circuit 35 and the resistor element 37 by switching ON and OFF of the switch element 36. The input support device 3 can thereby change the signal intensity (amplitude) of the output signal Vo while setting the resonant frequency fr of the LC circuit 35 to be constant by the operation of the adjustment circuit 38, as illustrated in FIG. 7 to FIG. 9.

The input support device 3 can adjust the signal intensity (amplitude) of the output signal Vo in accordance with detection sensitivity of the detection device 4 when mounted on the detection device 4 of a different type, for example. Alternatively, the input support device 3 can adjust the signal intensity (amplitude) of the output signal Vo so as to compensate variation in the detection sensitivity of the detection device 4 even when the detection sensitivity of the detection device 4 varies over time.

Second Embodiment

Figure 10:
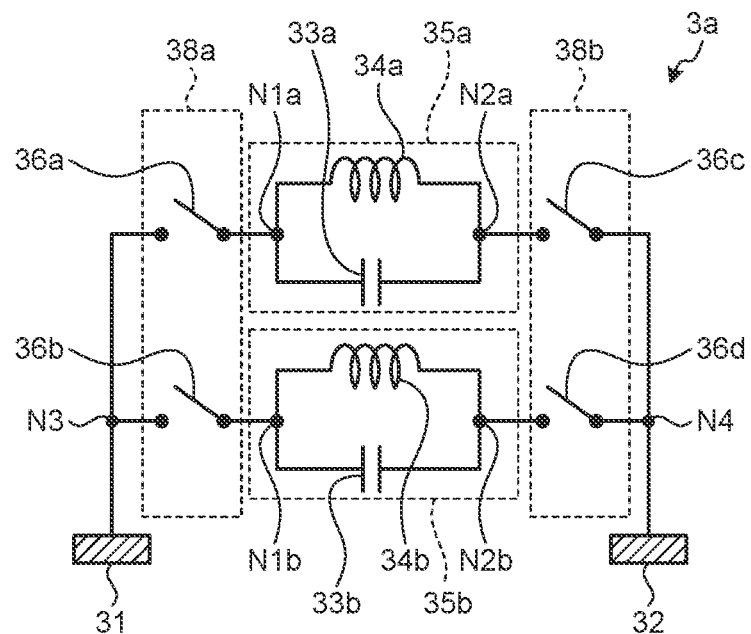
FIG. 10 is an equivalent circuit diagram illustrating an input support device according to a second embodiment.

FIG. 10 is an equivalent circuit diagram illustrating an input support device according to a second embodiment. In the following explanation, the same reference numerals denote the same components described in the above-mentioned embodiment and overlapped explanation thereof is omitted.

As illustrated in FIG. 10, an input support device 3a according to the second embodiment includes a first LC circuit 35a, a second LC circuit 35b, a first adjustment circuit 38a, and a second adjustment circuit 38b. The first LC circuit 35a includes a capacitor 33a and an inductor 34a that are coupled in parallel. The second LC circuit 35b includes a capacitor 33b and an inductor 34b that are coupled in parallel.

The first LC circuit 35a and the second LC circuit 35b are arranged in parallel between the first electrode 31 and the second electrode 32. That is to say, a coupling portion N1a of the first LC circuit 35a on one end side and a coupling portion N1b of the second LC circuit 35b on one end side are provided so as to be coupled to the first electrode 31 through the first adjustment circuit 38a. A coupling portion N2a of the first LC circuit 35a on the other end side and a coupling portion N2b of the second LC circuit 35b on the other end side are provided so as to be coupled to the second electrode 32 through the second adjustment circuit 38b.

The first adjustment circuit 38a is a switch circuit including a first switch element 36a and a second switch element 36b. One end side of the first switch element 36a is coupled to the coupling portion N3 on the first electrode 31 side, and the other end side of the first switch element 36a is coupled to the coupling portion N1a of the first LC circuit 35a on one end side. The first switch element 36a thereby switches a coupling state between the coupling portion N1a of the first LC circuit 35a on one end side and the first electrode 31.

Similarly, one end side of the second switch element 36b is coupled to the coupling portion N3 on the first electrode 31 side, and the other end side of the second switch element 36b is coupled to the coupling portion N1b of the second LC circuit 35b on one end side. The second switch element 36b switches a coupling state between the coupling portion N1b of the second LC circuit 35b on one end side and the first electrode 31.

The second adjustment circuit 38b is a switch circuit including a third switch element 36c and a fourth switch element 36d. One end side of the third switch element 36c is coupled to the coupling portion N2a of the first LC circuit 35a on the other end side, and the other end side of the third switch element 36c is coupled to a coupling portion N4 on the second electrode 32 side. The third switch element 36c thereby switches a coupling state between the coupling portion N2a of the first LC circuit 35a on the other end side and the second electrode 32.

Similarly, one end side of the fourth switch element 36d is coupled to the coupling portion N2b of the second LC circuit 35b on the other end side, and the other end side of the fourth switch element 36d is coupled to the coupling portion N4 on the second electrode 32 side. The fourth switch element 36d switches a coupling state between the coupling portion N2b of the second LC circuit 35b on the other end side and the second electrode 32.

The first adjustment circuit 38a and the second adjustment circuit 38b can switch the coupling states of the first LC circuit 35a and the second LC circuit 35b between the first electrode 31 and the second electrode 32. To be specific, when the first switch element 36a is in an ON state and the third switch element 36c is in an ON state, the first LC circuit 35a is coupled between the first electrode 31 and the second electrode 32. When the first switch element 36a is in an OFF state and the third switch element 36c is in an OFF state, the first LC circuit 35a is not coupled.

Similarly, when the second switch element 36b is in an ON state and the fourth switch element 36d is in an ON state, the second LC circuit 35b is coupled between the first electrode 31 and the second electrode 32. When the second switch element 36b is in an OFF state and the fourth switch element 36d is in an OFF state, the second LC circuit 35b is not coupled.

The first adjustment circuit 38a and the second adjustment circuit 38b operate synchronously. For example, when the first switch element 36a is in the ON state, the third switch element 36c is turned ON, and when the first switch element 36a is in the OFF state, the third switch element 36c is turned OFF. When the second switch element 36b is in the ON state, the fourth switch element 36d is turned ON, and when the second switch element 36b is in the OFF state, the fourth switch element 36d is turned OFF.

As described above, the input support device 3a can switch the first LC circuit 35a or the second LC circuit 35b that is coupled between the first electrode 31 and the second electrode 32 by the operations of the first adjustment circuit 38a and the second adjustment circuit 38b.

Figure 11:
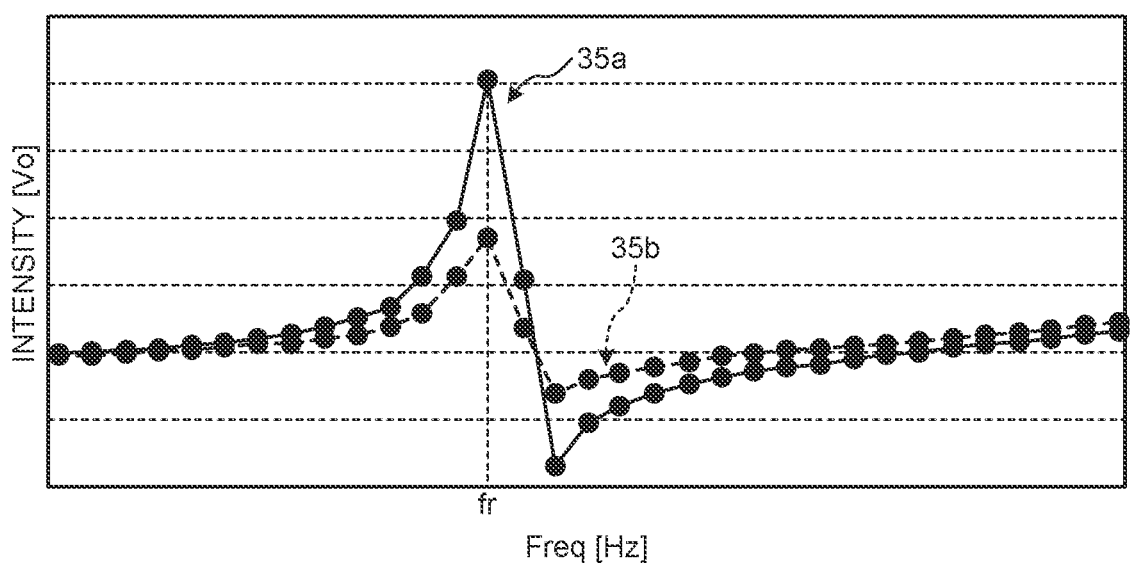
FIG. 11 is a graph schematically illustrating a relation between a signal intensity of an output signal and a frequency of a detection drive signal in the input support device according to the second embodiment.

FIG. 11 is a graph schematically illustrating a relation between a signal intensity of an output signal and a frequency of a detection drive signal in the input support device according to the second embodiment. FIG. 11 illustrates the case in which the first LC circuit 35a is coupled between the first electrode 31 and the second electrode 32 and the second LC circuit 35b is not coupled, and the case in which the second LC circuit 35b is coupled between the first electrode 31 and the second electrode 32 and the first LC circuit 35a is not coupled. The capacitance value of the capacitor 33a of the first LC circuit 35a is 10 pF and the inductance value (hereinafter, referred to as L value) of the inductor 34a thereof is 60 mH in FIG. 11. The capacitance value of the capacitor 33b of the second LC circuit 35b is 22 pF, and the L value of the inductor 34b thereof is 30 mH.

As illustrated in FIG. 11, when the first LC circuit 35a is coupled between the first electrode 31 and the second electrode 32 by the operations of the first adjustment circuit 38a and the second adjustment circuit 38b, the signal intensity (amplitude) of the output signal Vo is higher than that in the case in which the second LC circuit 35b is coupled. Variation in the resonant frequency fr is small between the case in which the first LC circuit 35a is coupled between the first electrode 31 and the second electrode 32, and the case in which the second LC circuit 35b is coupled therebetween.

The input support device 3a can thus vary the signal intensity (amplitude) of the output signal Vo while setting the resonant frequency fr to be constant. FIG. 11 illustrates the example in which one of the first LC circuit 35a and the second LC circuit 35b is coupled between the first electrode 31 and the second electrode 32. Alternatively, both of the first LC circuit 35a and the second LC circuit 35b may be coupled by the operations of the first adjustment circuit 38a and the second adjustment circuit 38b. The input support device 3a is not limited to the first LC circuit 35a and the second LC circuit 35b and may include equal to or more than three LC circuits 35.

First Modification

Figure 12:
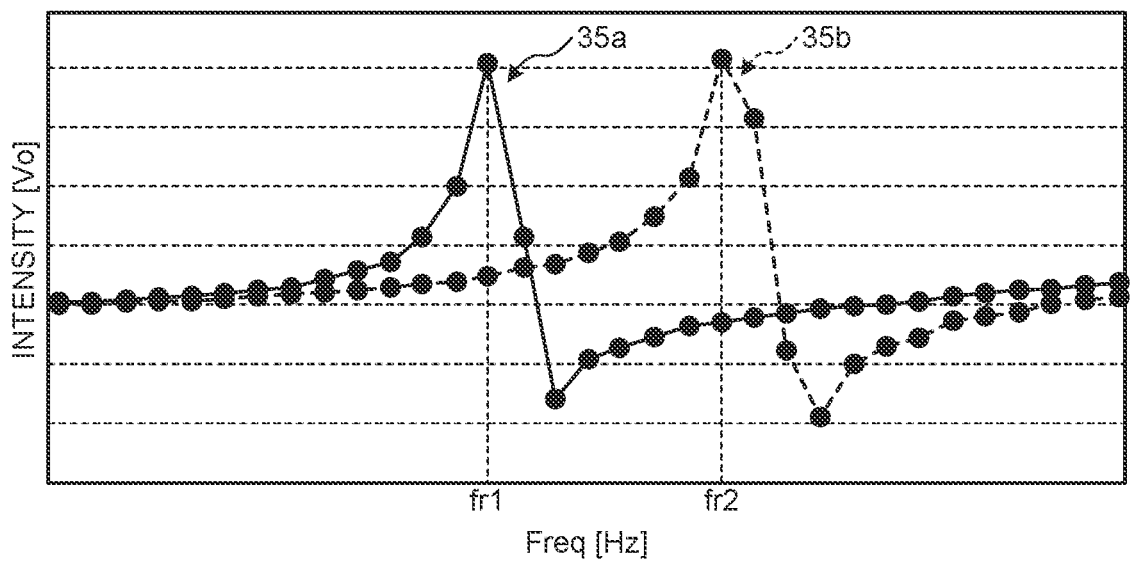
FIG. 12 is a graph schematically illustrating a relation between a signal intensity of an output signal and a frequency of a detection drive signal in an input support device according to a first modification.

FIG. 12 is a graph schematically illustrating a relation between a signal intensity of an output signal and a frequency of a detection drive signal in an input support device according to a first modification. In the first modification, the configuration of the input support device 3a is similar to that in the equivalent circuit diagram illustrated in FIG. 10. The capacitance values and the L values of the first LC circuit 35a and the second LC circuit 35b that are illustrated in FIG. 11 are merely examples and can be appropriately changed.

For example, the capacitance value of the capacitor 33a of the first LC circuit 35a is 10 pF and the inductance value (hereinafter, referred to as L value) of the inductor 34a thereof is 60 mH in FIG. 12. The capacitance value of the capacitor 33b of the second LC circuit 35b is 8 pF, and the L value of the inductor 34b thereof is 50 mH.

As illustrated in FIG. 12, a resonant frequency fr1 and a resonant frequency fr2 can be made different for each of coupling states of the first LC circuit 35a and the second LC circuit 35b by the operations of the first adjustment circuit 38a and the second adjustment circuit 38b. The resonant frequency fr1 is a resonant frequency when the first LC circuit 35a is coupled between the first electrode 31 and the second electrode 32 and the second LC circuit 35b is not coupled. The resonant frequency fr2 is a resonant frequency when the second LC circuit 35b is coupled between the first electrode 31 and the second electrode 32 and the first LC circuit 35a is not coupled. The resonant frequency fr2 is higher than the resonant frequency fr1.

Variation in the signal intensity (amplitude) of the output signal Vo is small between the case in which the first LC circuit 35a is coupled between the first electrode 31 and the second electrode 32, and the case in which the second LC circuit 35b is coupled therebetween. The input support device 3a in the first modification can thus vary the resonant frequency fr while setting the signal intensity (amplitude) of the output signal Vo to be constant by changing the capacitance values and the L values of the first LC circuit 35a and the second LC circuit 35b in comparison with the second embodiment.

Third Embodiment

Figure 13:
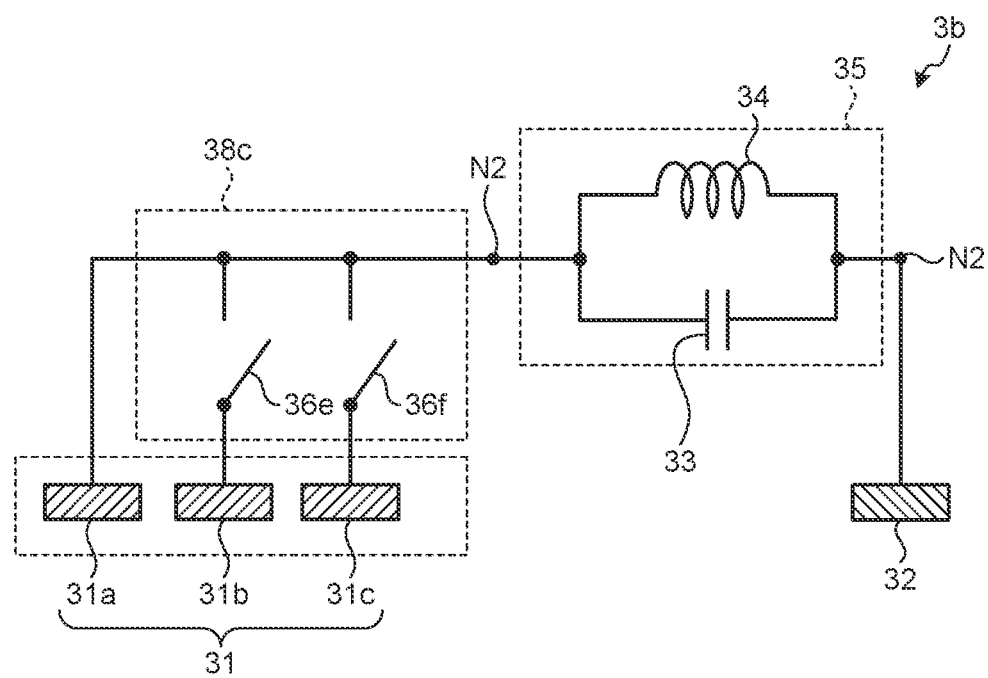
FIG. 13 is an equivalent circuit diagram illustrating an input support device according to a third embodiment.

FIG. 13 is an equivalent circuit diagram illustrating an input support device according to a third embodiment. As illustrated in FIG. 13, an input support device 3b according to the third embodiment includes a plurality of first electrodes 31 (first electrodes 31a, 31b, and 31c). An adjustment circuit 38c switches coupling states between the first electrodes 31 and the coupling portion N1 of the LC circuit 35 on one end side.

To be specific, the adjustment circuit 38c includes a plurality of switch elements 36e and 36f. The switch element 36e switches a coupling state between the first electrode 31b and the coupling portion N1 of the LC circuit 35 on one end side. The switch element 36f switches a coupling state between the first electrode 31c and the coupling portion N1 of the LC circuit 35 on one end side. The first electrode 31a is coupled to the coupling portion N1 of the LC circuit 35 on one end side without going through the switch elements 36e and 36f.

For example, the adjustment circuit 38c can couple the first electrodes 31a and 31b to the coupling portion N1 of the LC circuit 35 on one end side and cause the first electrode 31c not to be coupled by turning the switch element 36e ON and turning the switch element 36f OFF. The adjustment circuit 38c can couple the first electrodes 31a, 31b, and 31c to the coupling portion N1 of the LC circuit 35 on one end side by turning the switch element 36e and the switch element 36f ON.

The input support device 3b can thus change the number of first electrodes 31 that are coupled to the coupling portion N1 of the LC circuit 35 on one end side by the operation of the adjustment circuit 38c. That is to say, the capacitances C1 and C4 (refer to FIG. 5) that are formed between the first electrode 31 and the drive electrode Tx and the detection electrode Rx facing the first electrode 31 can be adjusted by changing the number (area) of the first electrodes 31.

Figure 14:
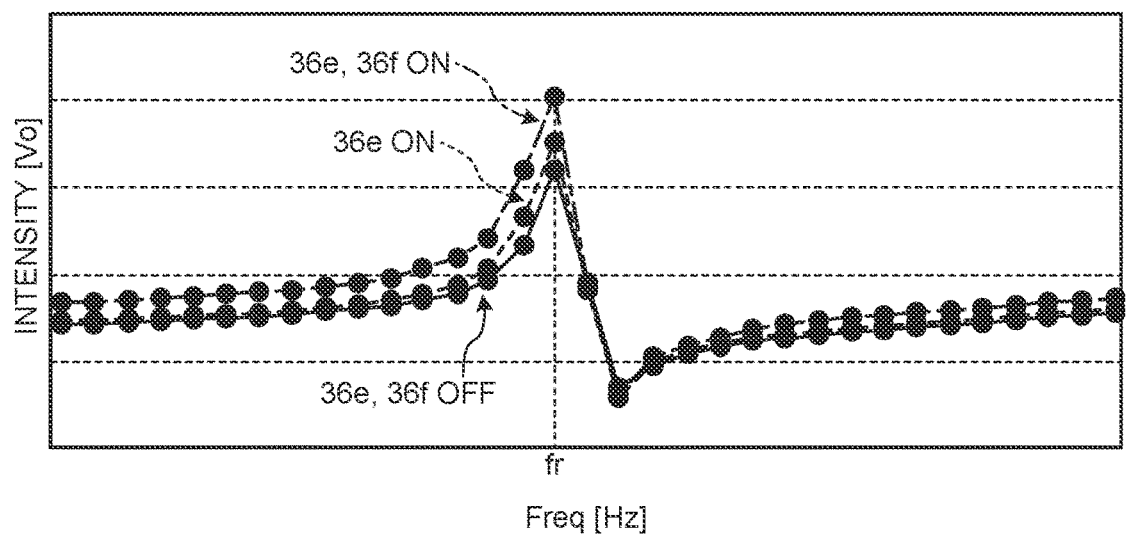
FIG. 14 is a graph schematically illustrating a relation between a signal intensity of an output signal and a frequency of a detection drive signal in the input support device according to the third embodiment.

FIG. 14 is a graph schematically illustrating a relation between a signal intensity of an output signal and a frequency of a detection drive signal in the input support device according to the third embodiment. FIG. 14 illustrates the relation between the signal intensity of the output signal Vo and the frequency of the detection drive signal VD for each of coupling states of the switch elements 36e and 36f of the adjustment circuit 38c.

As illustrated in FIG. 14, the signal intensity of the output signal Vo is lowered when both of the switch elements 36e and 36f are in OFF states, that is, when the first electrode 31a is coupled to the coupling portion N1 of the LC circuit 35 on one end side and the first electrodes 31b and 31c are not coupled. The signal intensity of the output signal Vo is maximized when both of the switch elements 36e and 36f are in ON states, that is, when the first electrodes 31a, 31b, and 31c are coupled to the coupling portion N1 of the LC circuit 35 on one end side. The signal intensity of the output signal Vo takes intermediate values when the switch elements 36e is in the ON state and the switch element 36f is in the OFF state, that is, when the first electrodes 31a and 31b are coupled to the coupling portion N1 of the LC circuit 35 on one end side and the first electrode 31c is not coupled.

The resonant frequency fr is constant regardless of the coupling states of the first electrodes 31a, 31b, and 31c. The input support device 3b according to the third embodiment can thus vary the signal intensity (amplitude) of the output signal Vo while setting the resonant frequency fr to be constant by the operation of the adjustment circuit 38c. The adjustment circuit 38c is not limited to the configuration provided at the coupling portion N1 of the LC circuit 35 on one end side. The adjustment circuit 38c may be provided also at the coupling portion N2 of the LC circuit 35 on the other end side when the second electrodes 32 are provided (refer to FIG. 18), for example. The number of switch elements 36 included in the adjustment circuit 38c is not limited to two, and it is sufficient that at least equal to or more than one switch element 36 is provided. That is to say, the adjustment circuit 38c may include one or equal to or more than three switch elements 36 in accordance with the number of first electrodes 31.

Fourth Embodiment

Figure 15:
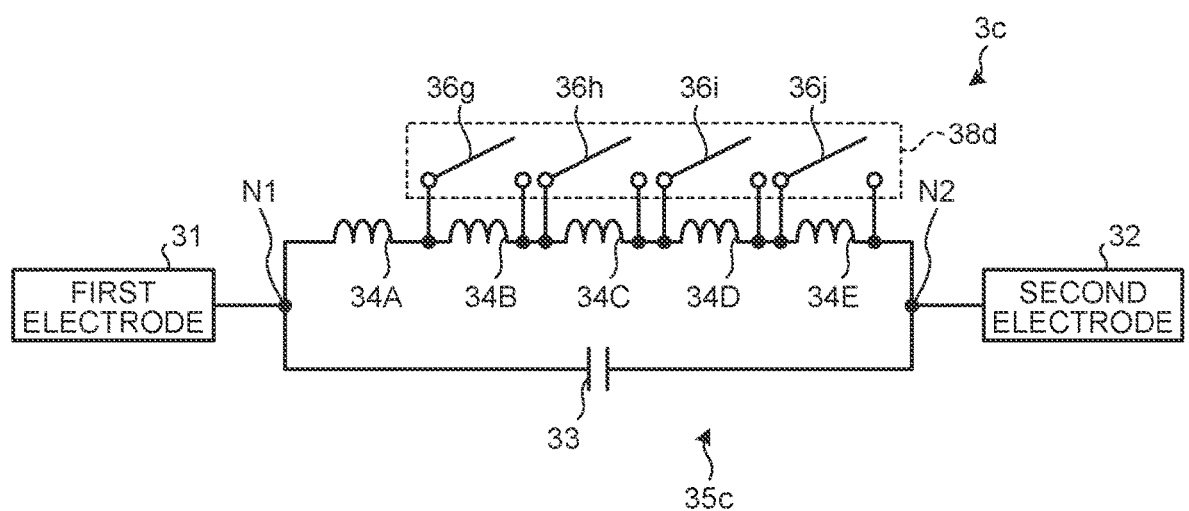
FIG. 15 is an equivalent circuit diagram illustrating an input support device according to a fourth embodiment.

FIG. 15 is an equivalent circuit diagram illustrating an input support device according to a fourth embodiment. As illustrated in FIG. 15, in an input support device 3c according to the fourth embodiment, an LC circuit 35c includes a plurality of inductors 34A, 34B, 34C, 34D, and 34E that are coupled in series between the coupling portion N1 on one end side and the coupling portion N2 on the other end side.

An adjustment circuit 38d includes a plurality of switch elements 36g, 36h, 36i, and 36j that are coupled in parallel to the inductors 34B, 34C, 34D, and 34E, respectively. When any of the switch elements 36g, 36h, 36i, and 36j is turned ON, the corresponding inductor 34B, 34C, 34D, or 34E is short-circuited. When the switch element 36g is turned ON and the other switch elements 36h, 36i, and 36j are in OFF states, for example, one end side and the other end side of the inductor 34B are short-circuited, and the inductor 34A and the inductor 34C are coupled in series without going through the inductor 34B. In this manner, the adjustment circuit 38d can make an inductance value between the first electrode 31 and the second electrode 32 variable by operations of the switch elements 36g, 36h, 36i, and 36j. No switch element is provided for the inductor 34A.

Figure 16:
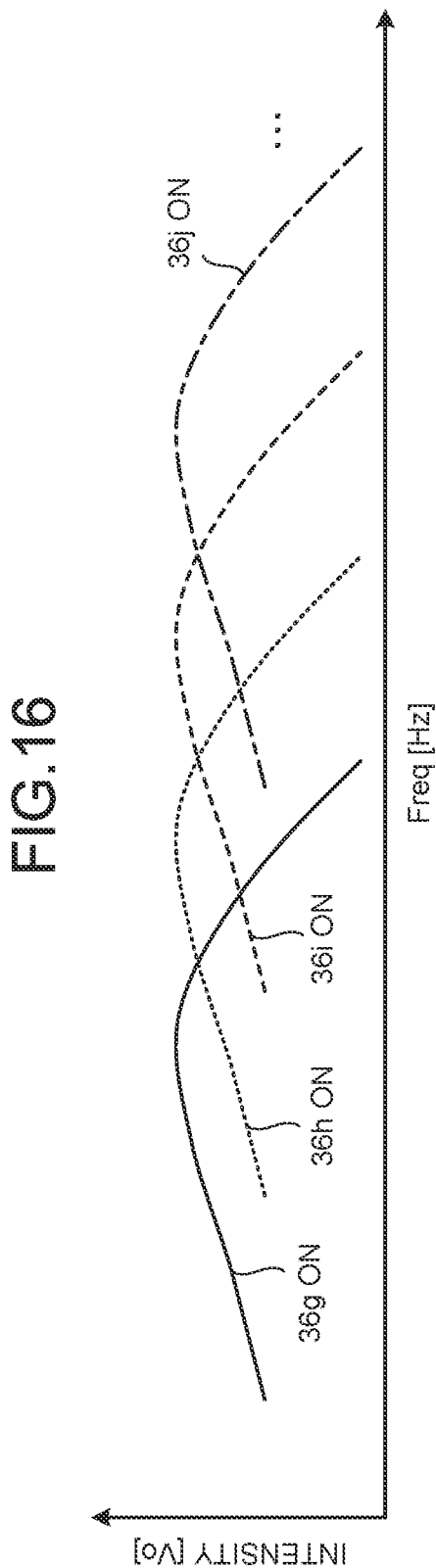
FIG. 16 is a graph schematically illustrating a relation between a signal intensity of an output signal and a frequency of a detection drive signal in the input support device according to the fourth embodiment.

FIG. 16 is a graph schematically illustrating a relation between a signal intensity of an output signal and a frequency of a detection drive signal in the input support device according to the fourth embodiment. FIG. 16 illustrates the relation between the signal intensity of the output signal and the frequency of the detection drive signal for each of the switch elements 36g, 36h, 36i, and 36j that is turned ON. FIG. 16 illustrates the case in which the inductance values of the inductors 34A, 34B, 34C, 34D, and 34E are different.

For example, it is assumed that the inductance value of the inductor 34A is x(H), the inductance value of the inductor 34B is y(H), the inductance value of the inductor 34C is 2×xy(H), the inductance value of the inductor 34D is 4×xy(H), and the inductance value of the inductor 34E is 8×xy(H). That is to say, the inductance values of the inductors 34B, 34C, 34D, and 34E are increased in this order.

As illustrated in FIG. 16, the adjustment circuit 38d can vary the resonant frequency fr of the LC circuit 35c by changing the switch element 36g, 36h, 36i, or 36j that is turned ON. With the above-mentioned relation of the inductance value, the resonant frequency fr is increased as the switch element 36g is turned ON, the switch element 36h is turned ON, the switch element 36i is turned ON, and the switch element 36j is turned ON in this order. In other words, the total inductance value between the first electrode 31 and the second electrode 32 is decreased by switching the switch element 36 that is turned ON in the order of the switch elements 36g, 36h, 36i, and 36j.

The input support device 3c according to the fourth embodiment can thus vary the resonant frequency fr of the LC circuit 35c while setting the signal intensity (amplitude) of the output signal Vo to be constant by the operation of the adjustment circuit 38d. The input support device 3c can appropriately adjust the resonant frequency fr in accordance with the inductance values of the inductors 34A, 34B, 34C, 34D, and 34E and the number of combinations of ON and OFF of the switch elements 36g, 36h, 36i, and 36j.

The inductance values of the inductors 34A, 34B, 34C, 34D, and 34E may be different from each other. Alternatively, the inductance values of the inductors 34A, 34B, 34C, 34D, and 34E may be the same. The number of switch elements 36 that are turned ON among the switch elements 36g, 36h, 36i, and 36j can be desirably changed from zero to four. The number of inductors 34A, 34B, 34C, 34D, and 34E that are coupled in series is not limited to five and may be equal to or less than four or equal to or more than six. The number of switch elements 36g, 36h, 36i, and 36j is also not limited to four and may be equal to or less than three or equal to or more than five.

In the above-mentioned first embodiment to fourth embodiment and first modification, the case that is one of the resonant frequency fr and the signal intensity (amplitude) of the output signal Vo is set to be constant while the other of the resonant frequency fr and the signal intensity (amplitude) of the output signal Vo is made variable in order to facilitate explanation is described. The configuration is however not limited thereto, and both of the resonant frequency fr and the signal intensity (amplitude) of the output signal Vo may be made variable. That is to say, the configurations in the first embodiment to fourth embodiment and first modification can be appropriately combined. In the configurations in the first embodiment to third embodiment and first modification, for example, the inductors 34 and the switch elements 36 may be provided as in the fourth embodiment.

Fifth Embodiment

Figure 17:
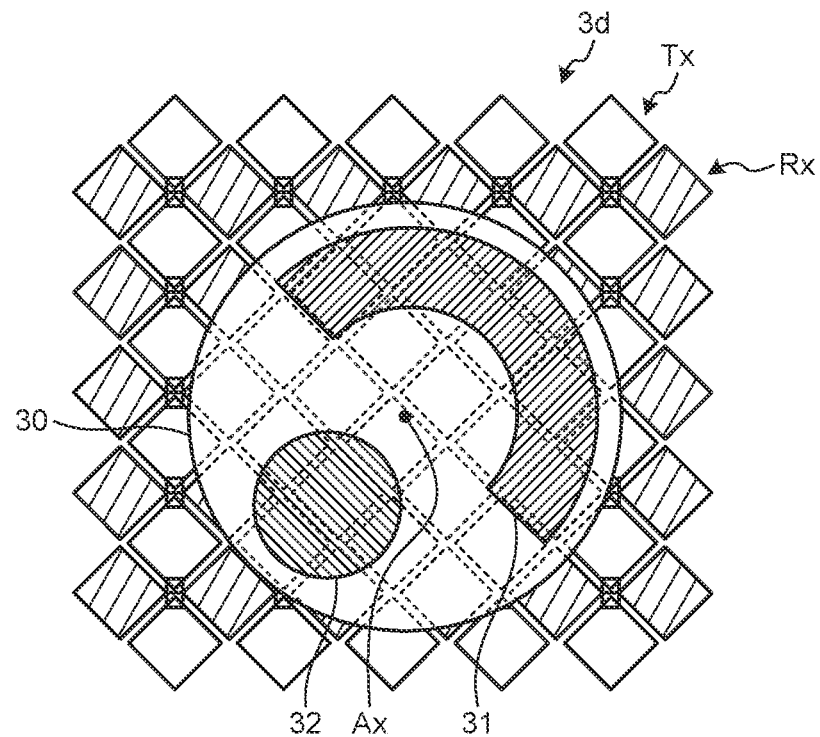
FIG. 17 is a plan view schematically illustrating an input support device according to a fifth embodiment.

FIG. 17 is a plan view schematically illustrating an input support device according to a fifth embodiment. In the fifth embodiment, an example of the configurations of the first electrode 31 and the second electrode 32 of an input support device 3d is described. As illustrated in FIG. 17, the input support device 3d in the fifth embodiment has a shorter length of the first electrode 31 along the circular arc thereof as compared with the input support device 3 described in the first embodiment (refer to FIG. 4). The first electrode 31 has a curved shape curved along the circular arc of a semicircle. The second electrode 32 is located on the outer side of a virtual line connecting one end and the other end of the first electrode 31 along the circular arc thereof.

The number of drive electrodes Tx overlapping with the first electrode 31 is larger than the number of drive electrodes Tx overlapping with the second electrode 32 also in the present embodiment. Accordingly, even when the first electrode 31 and the second electrode 32 are arranged so as to overlap with the common drive electrode Tx, at least a part of the first electrode 31 is arranged so as to overlap with the drive electrode Tx differing from the second electrode 32. Accordingly, signals with different potentials are supplied to the first electrode 31 and the second electrode 32, so that resonance of the LC circuit 35 can be generated.

Second Modification

Figure 18:
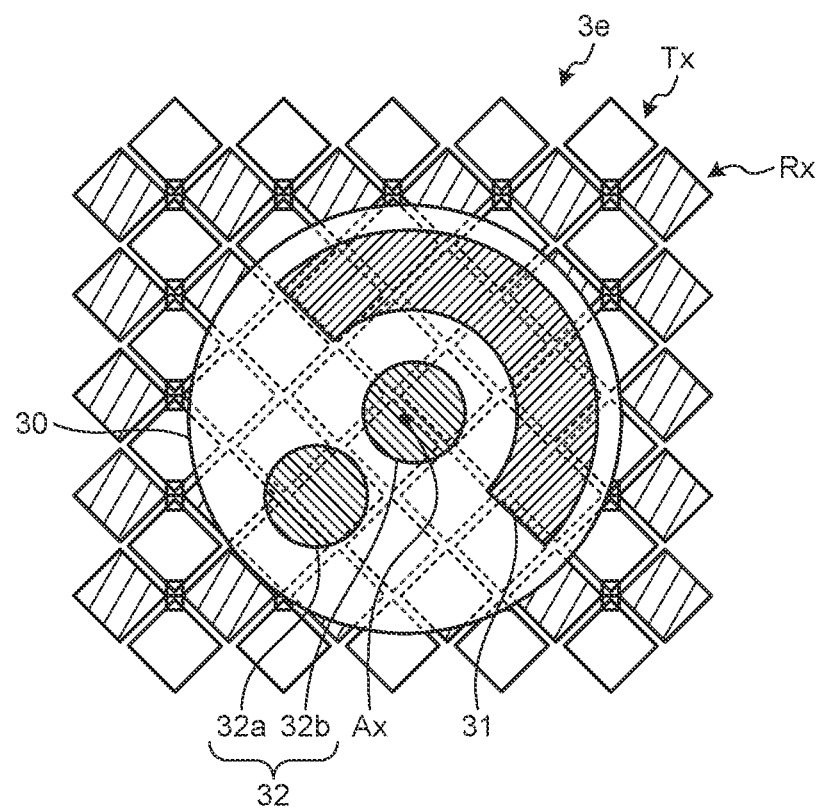
FIG. 18 is a plan view schematically illustrating an input support device according to a second modification.

FIG. 18 is a plan view schematically illustrating an input support device according to a second modification. As illustrated in FIG. 18, an input support device 3e in the second modification includes a plurality of second electrodes 32a and 32b. That is to say, the number of first electrodes 31 is different from the number of second electrodes 32. The second electrode 32a is provided at a position not overlapping with the rotating axis AX, and the second electrode 32b is provided at a position overlapping with the rotating axis AX. In other words, the second electrode 32b is arranged between the second electrode 32a and the first electrode 31. The input support device 3e can detect the rotation operation RT in addition to detection of the position of the input support device 3e by detecting the respective positions of the two second electrodes 32a and 32b.

Third Modification

Figure 19:
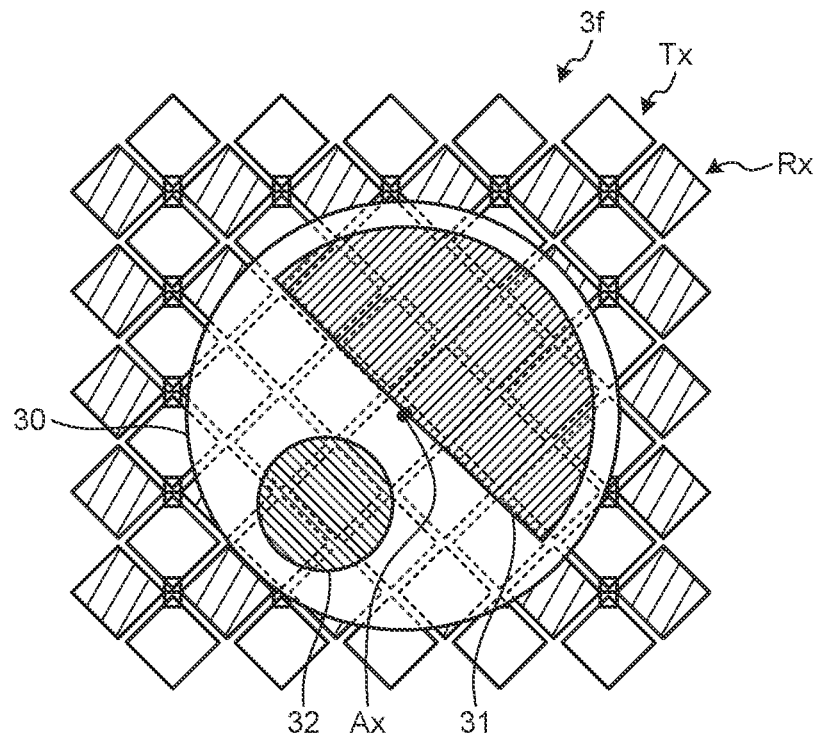
FIG. 19 is a plan view schematically illustrating an input support device according to a third modification.

FIG. 19 is a plan view schematically illustrating an input support device according to a third modification. As illustrated in FIG. 19, the first electrode 31 is formed into a semicircular shape in an input support device 3f in the third modification. In the input support device 3f in the third modification, the area of the first electrode 31 is larger than those in the above-mentioned embodiments and modifications. Accordingly, at least a part of the first electrode 31 is arranged so as to overlap with the drive electrode Tx differing from the second electrode 32, so that resonance of the LC circuit 35 can be generated.

Fourth Modification

Figure 20:
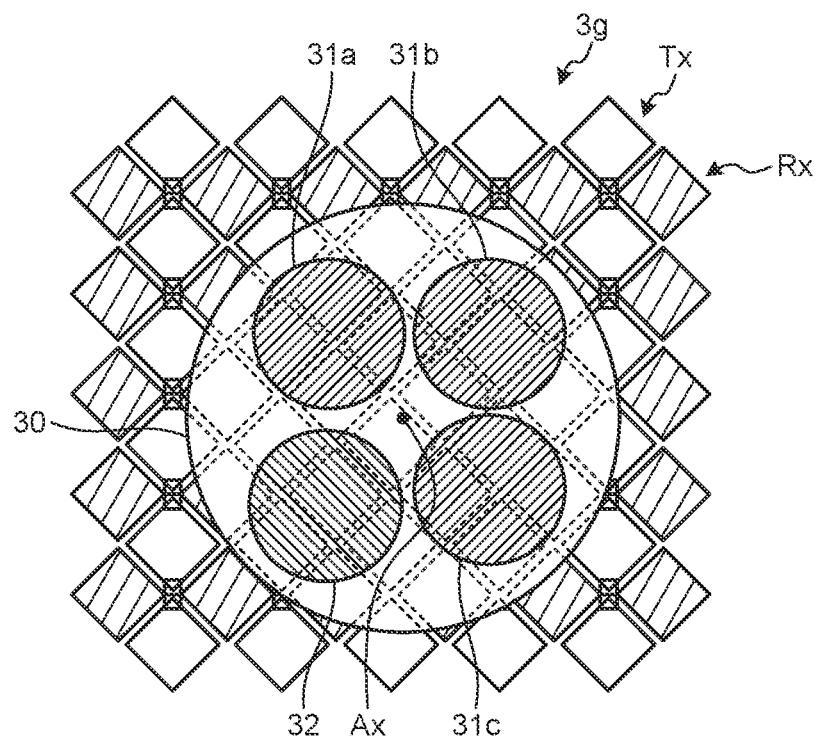
FIG. 20 is a plan view schematically illustrating an input support device according to a fourth modification.

FIG. 20 is a plan view schematically illustrating an input support device according to a fourth modification. As illustrated in FIG. 20, an input support device 3g in the fourth modification includes a plurality of first electrodes 31a, 31b, and 31c. The first electrodes 31a, 31b, and 31c and the second electrode 32 all have circular shapes and have the same shape and area. The shapes and areas thereof are however not limited thereto, and the first electrodes 31a, 31b, and 31c and the second electrode 32 may have different shapes and areas. The configuration of the input support device 3g in the fourth modification can be applied to the above-mentioned third embodiment (FIG. 13).

Fifth Modification

Figure 21:
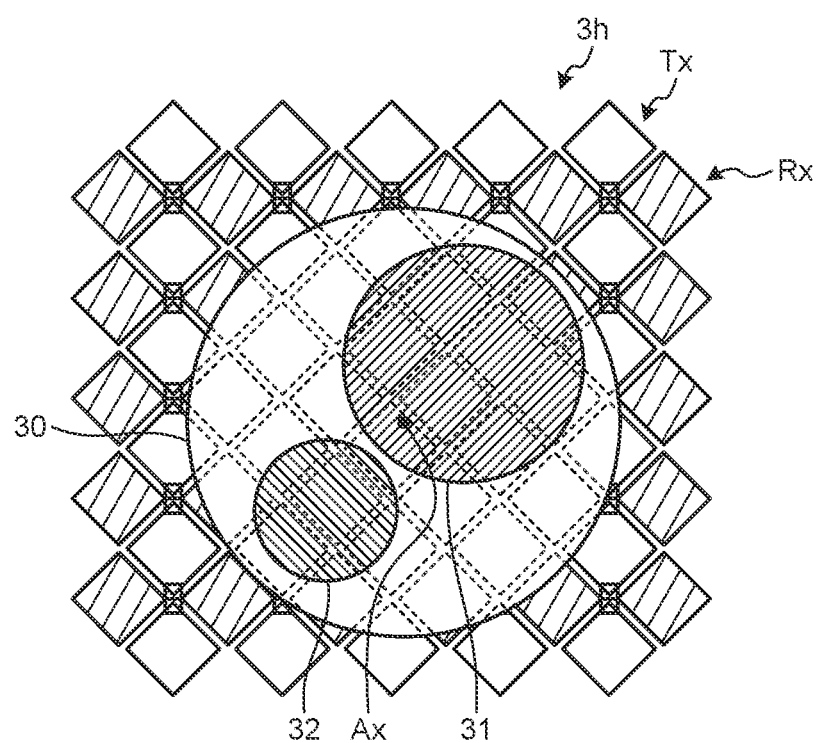
FIG. 21 is a plan view schematically illustrating an input support device according to a fifth modification.

FIG. 21 is a plan view schematically illustrating an input support device according to a fifth modification. As illustrated in FIG. 21, the first electrode 31 has a circular shape and is formed to have a diameter larger than the diameter of the second electrode 32 in an input support device 3h in the fifth modification. Even with this configuration, at least a part of the first electrode 31 is arranged so as to overlap with the drive electrode Tx differing from the second electrode 32, so that resonance of the LC circuit 35 can be generated, similarly to the above-mentioned examples.

Sixth Embodiment

Figure 22:
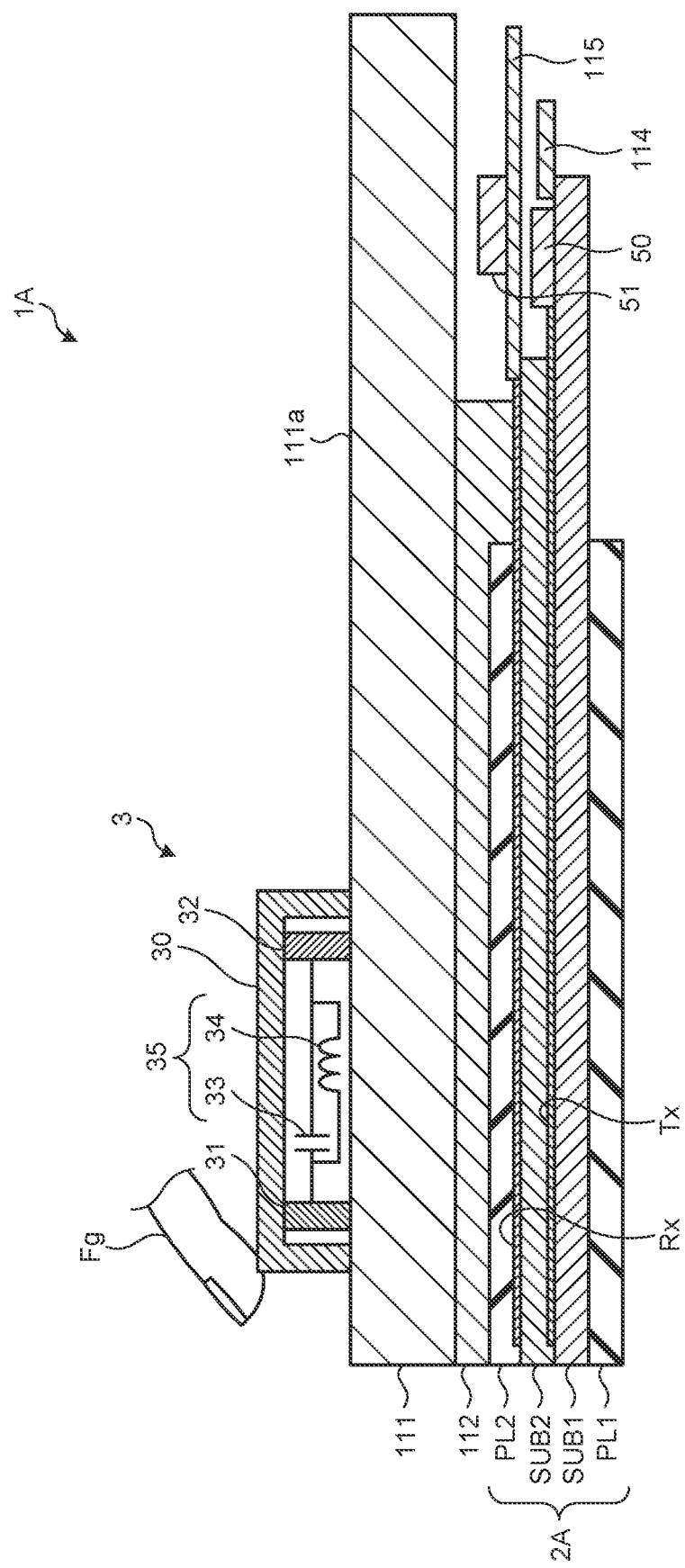
FIG. 22 is a cross-sectional view schematically illustrating an input detection system according to a sixth embodiment.

FIG. 22 is a cross-sectional view schematically illustrating an input detection system according to a sixth embodiment. As illustrated in FIG. 22, in an input detection system 1A according to the sixth embodiment, a display device 2A is provided by integrating the display device 2 and the detection device 4. That is to say, the drive electrodes Tx are provided above the array substrate SUB1 and are electrically coupled to the display IC 50. The detection electrodes Rx are provided above the counter substrate SUB2 and are electrically coupled to the detection IC 51.

The display device 2A can detect a detection target such as a finger Fg based on change in the mutual electrostatic capacitances Cm between the drive electrodes Tx and the detection electrodes Rx. The display device 2A detects a position and the like of the input support device 3 based on the change in the mutual electrostatic capacitances Cm and the resonance of the LC circuit 35 included in the input support device 3.

Although FIG. 22 omits illustration of the configuration of the input support device 3, any of the input support devices 3 and 3a to 3h described in the above-mentioned embodiments and modifications can be applied.

Seventh Embodiment

Figure 23:
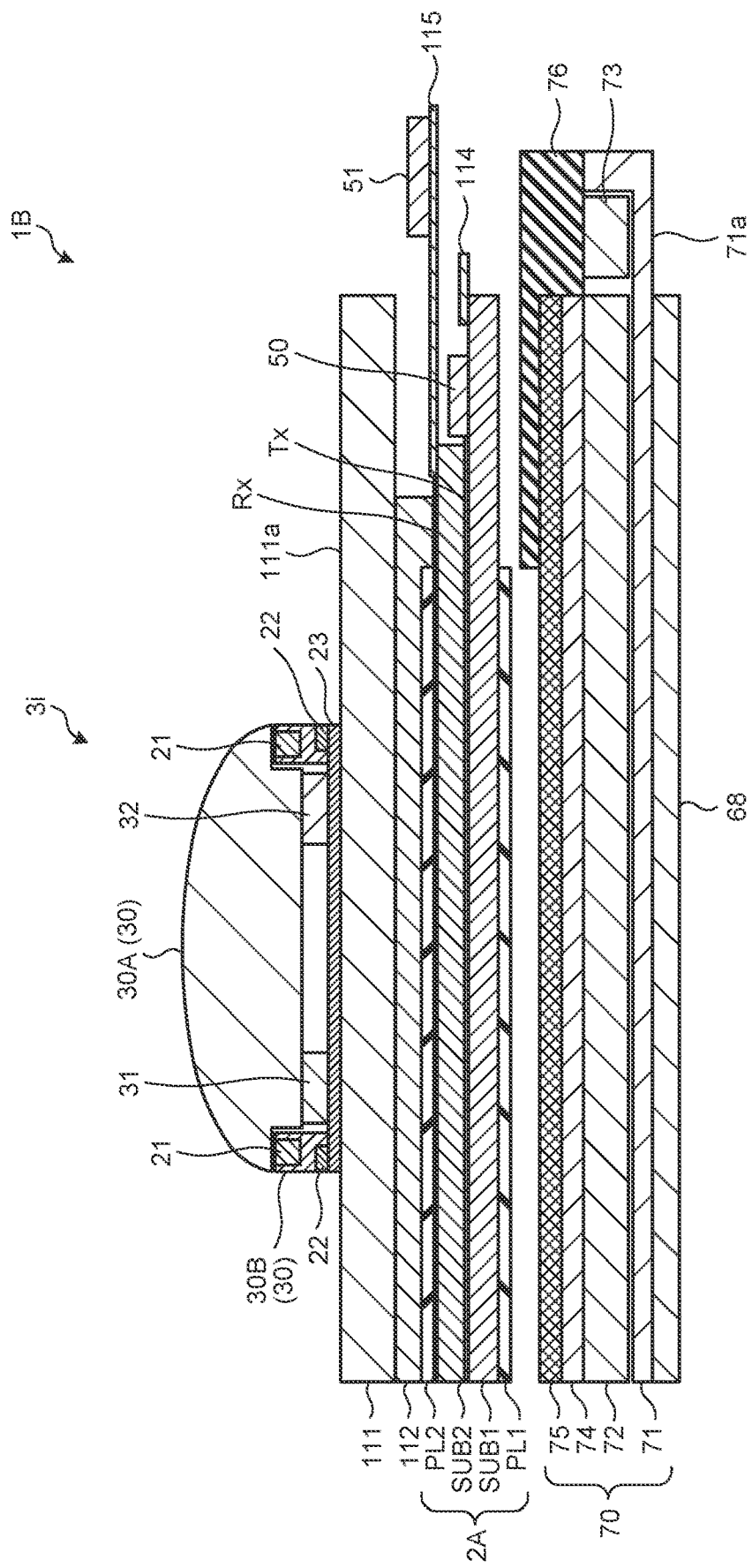
FIG. 23 is a cross-sectional view schematically illustrating an input detection system according to a seventh embodiment.

FIG. 23 is a cross-sectional view schematically illustrating an input detection system according to a seventh embodiment. The mounting structure of an input support device 3i is described in an input detection system 1B according to the seventh embodiment.

As illustrated in FIG. 23, the housing 30 of the input support device 3i includes a rotating body 30A and a support body 30B. The support body 30B is an annular member surrounding the first electrode 31 and the second electrode 32 and is provided above the cover member 111. To be specific, a protective film 23 is provided above the cover member 111, and the support body 30B is fixed to the protective film 23 with an adhesive layer 22 interposed therebetween. A magnet 21 is provided in the support body 30B. A ferromagnetic member 68 is arranged under the display device 2A, and an attractive force is generated between the magnet 21 and the ferromagnetic member 68. A position of the support body 30B above the cover member 111 is thereby fixed.

The rotating body 30A is supported on the support body 30B in a rotatable manner. The first electrode 31 and the second electrode 32 are mounted on the lower surface of the rotating body 30A and rotate together with the rotating body 30A. The protective film 23 is provided between the rotating body 30A and the support body 30B, and the cover member 111. When the first electrode 31 and the second electrode 32 rotate, the protective film 23 can prevent them from being brought into contact with the cover member 111. With the above-mentioned configuration, the input support device 3i is mounted above the display device 2A using the attractive force generated in the magnet 21.

The display device 2A is provided by integrating the display device 2 and the detection device 4 similarly to the sixth embodiment. The ferromagnetic member 68 is provided under the display device 2A, that is, at a position at which it does not inhibit display. In other words, the display device 2A, a backlight 70, and the cover member 111 are arranged between the ferromagnetic member 68 and the magnet 21 provided in the support body 30B of the input support device 3i.

To be more specific, the backlight 70 is provided under the display device 2A. The backlight 70 includes a frame 71, a light guiding plate 72, a light source 73, a diffusion sheet 74, a lens sheet 75, and a light shielding layer 76.

The frame 71 is a member accommodating therein the light guiding plate 72, the light source 73, the diffusion sheet 74, and the lens sheet 75. The light guiding plate 72, the diffusion sheet 74, and the lens sheet 75 are stacked in this order above the frame 71. The light source 73 includes a light emitting element such as an LED and is arranged on the lateral side of the light guiding plate 72. The light shielding layer 76 is provided so as to cover a part of the light source 73 and the lens sheet 75.

Light emitted from the light source 73 travels in the light guiding plate 72 while being repeatedly reflected a plurality of number of times and is output toward the display device 2A from the upper surface of the light guiding plate 72. The diffusion sheet 74 diffuses light output from the light guiding plate 72. The lens sheet 75 enhances directivity of light from the diffusion sheet 74. Light function layers such as the diffusion sheet 74 and the lens sheet 75 are provided as necessary. Equal to or more than three light function layers may be provided, or no light function layer may be provided.

The ferromagnetic member 68 is provided on a lower surface 61a of the frame 71. That is to say, the ferromagnetic member 68 faces the cover member 111 with the display device 2A and the backlight 70 interposed therebetween. The ferromagnetic member 68 is a plate-like member made of, for example, an iron-based metal material. In the example illustrated in FIG. 23, the ferromagnetic member 68 is provided so as to overlap with the entire display device 2A. The input support device 3*i* can thereby be fixed to a desired position above the display device 2A. The configuration is however not limited thereto, and a size and a position of the ferromagnetic member 68 can be appropriately changed. For example, the ferromagnetic member 68 may be provided so as to overlap with a part of the display device 2A.

The ferromagnetic member 68 may be fixed to the lower surface 71*a* of the frame 71 with an adhesive or may be fixed thereto by a fastening member such as a screw. The ferromagnetic member 68 is not limited to the configuration that is formed as a separate member from the frame 71, and a ferromagnetic member may be used as a material of the frame 71. In this case, at least a part (a region overlapping with the input support device 3*i*) of the frame 71 can be formed by the ferromagnetic member.

The configuration of the backlight 70 illustrated in FIG. 23 is merely an example, and another configuration may be employed. When an organic EL display panel or an inorganic EL display including a spontaneous light emitting element is used as the display device 2A, the backlight 70 can be omitted.

Sixth Modification of Seventh Embodiment

Figure 24:
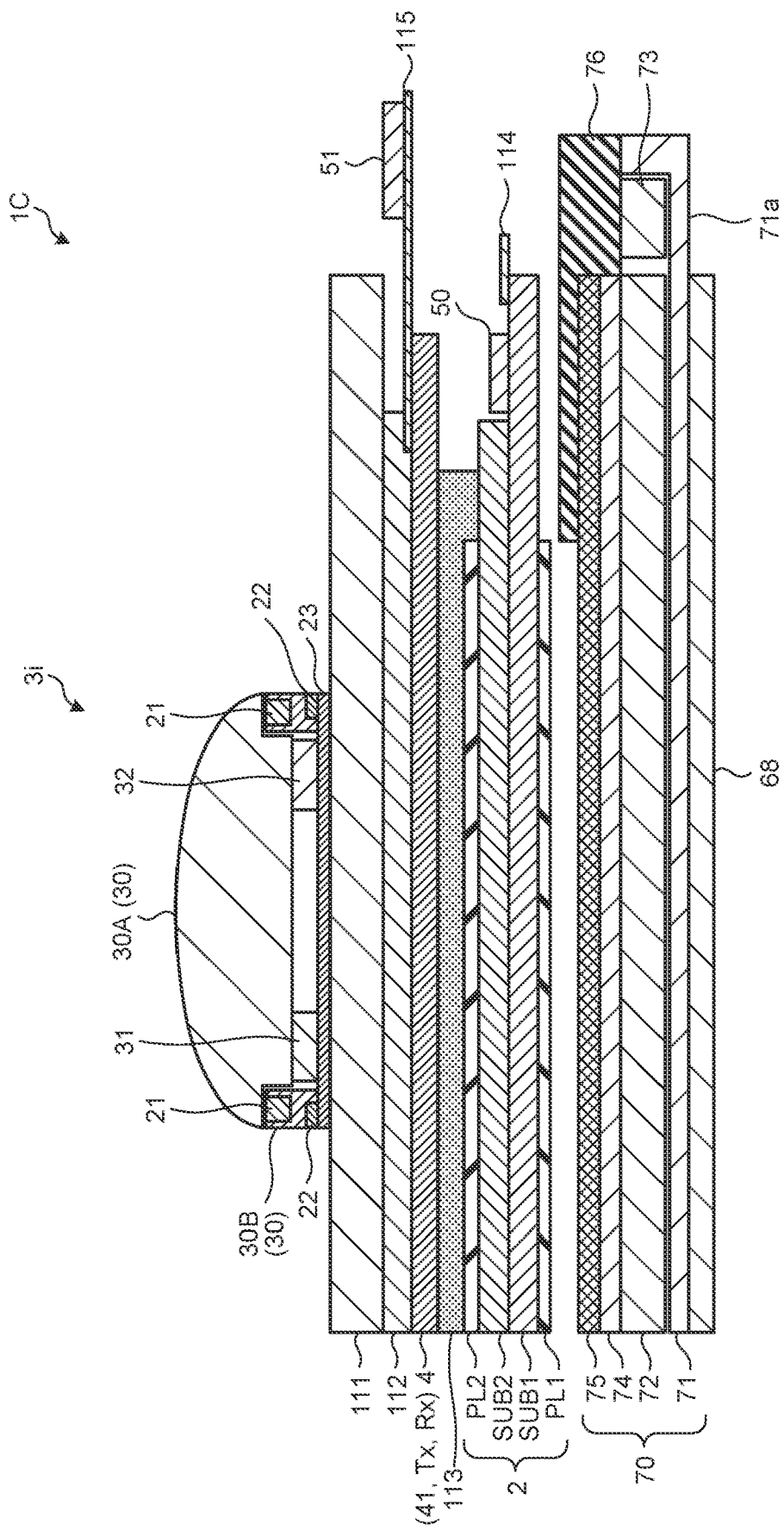
FIG. 24 is a cross-sectional view schematically illustrating an input detection system according to a sixth modification of the seventh embodiment.

FIG. 24 is a cross-sectional view schematically illustrating an input detection system according to a sixth modification of the seventh embodiment. As illustrated in FIG. 24, an input detection system 1C according to the sixth modification of the seventh embodiment is different in the configuration in which the detection device 4 is provided above the display device 2 as compared with the above-mentioned seventh embodiment. The configurations of the display device 2 and the detection device 4 are similar to those in the above-mentioned first embodiment, and detail explanation thereof is omitted. Also in the present modification, the input support device 3*i* includes the magnet 21, and the ferromagnetic member 68 is provided on the lower surface 71*a* of the frame 71 of the backlight 70, similarly to the seventh embodiment.

Seventh Modification of Seventh Embodiment

Figure 25:
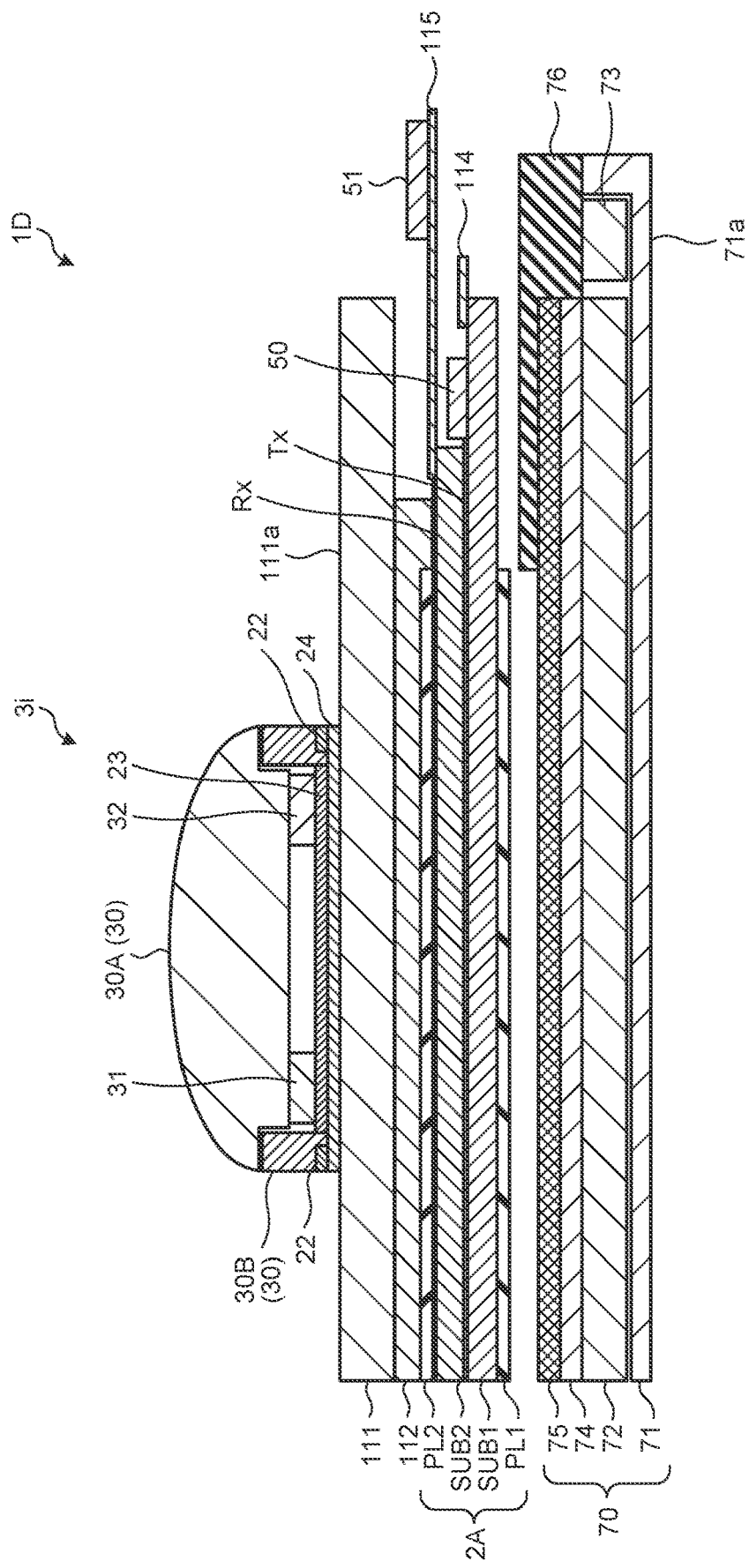
FIG. 25 is a cross-sectional view schematically illustrating an input detection system according to a seventh modification of the seventh embodiment.

FIG. 25 is a cross-sectional view schematically illustrating an input detection system according to a seventh modification of the seventh embodiment. Although the mounting structure of the input support device 3*i* using the attractive force generated between the magnet 21 and the ferromagnetic member 68 has been described in the above-mentioned seventh embodiment and sixth modification, the mounting structure is not limited thereto.

As illustrated in FIG. 25, in an input detection system 1D according to the seventh modification of the seventh embodiment, an adhesive sheet 24 is provided above the cover member 111. The input support device 3*i* is bonded onto the adhesive sheet 24. To be more specific, the adhesive sheet 24 is, for example, a silicone sheet having adhesiveness. The adhesiveness of the adhesive sheet 24 is weaker than that of the adhesive layer 22 such as double-sided tape and is provided above the cover member 111 in a detachable manner. The support body 30B of the input support device 3*i* is fixed onto the adhesive sheet 24 with the adhesive layer 22. A position of the input support device 3*i* above the cover member 111 is thus fixed with the adhesive sheet 24.

The protective film 23 is provided between the first electrode 31 and the second electrode 32 and the adhesive sheet 24 in a region surrounded by the support body 30B. The protective film 23 can prevent the first electrode 31 and the second electrode 32 from being brought into contact with the adhesive sheet 24. In this modification, no magnet 21 is provided in the support body 30B and no ferromagnetic member 68 is provided on the lower surface 71*a* of the frame 71. The display device 2A is configured by integrating the display device 2 and the detection device 4 similarly to the seventh embodiment.

Eighth Modification of Seventh Modification

Figure 26:
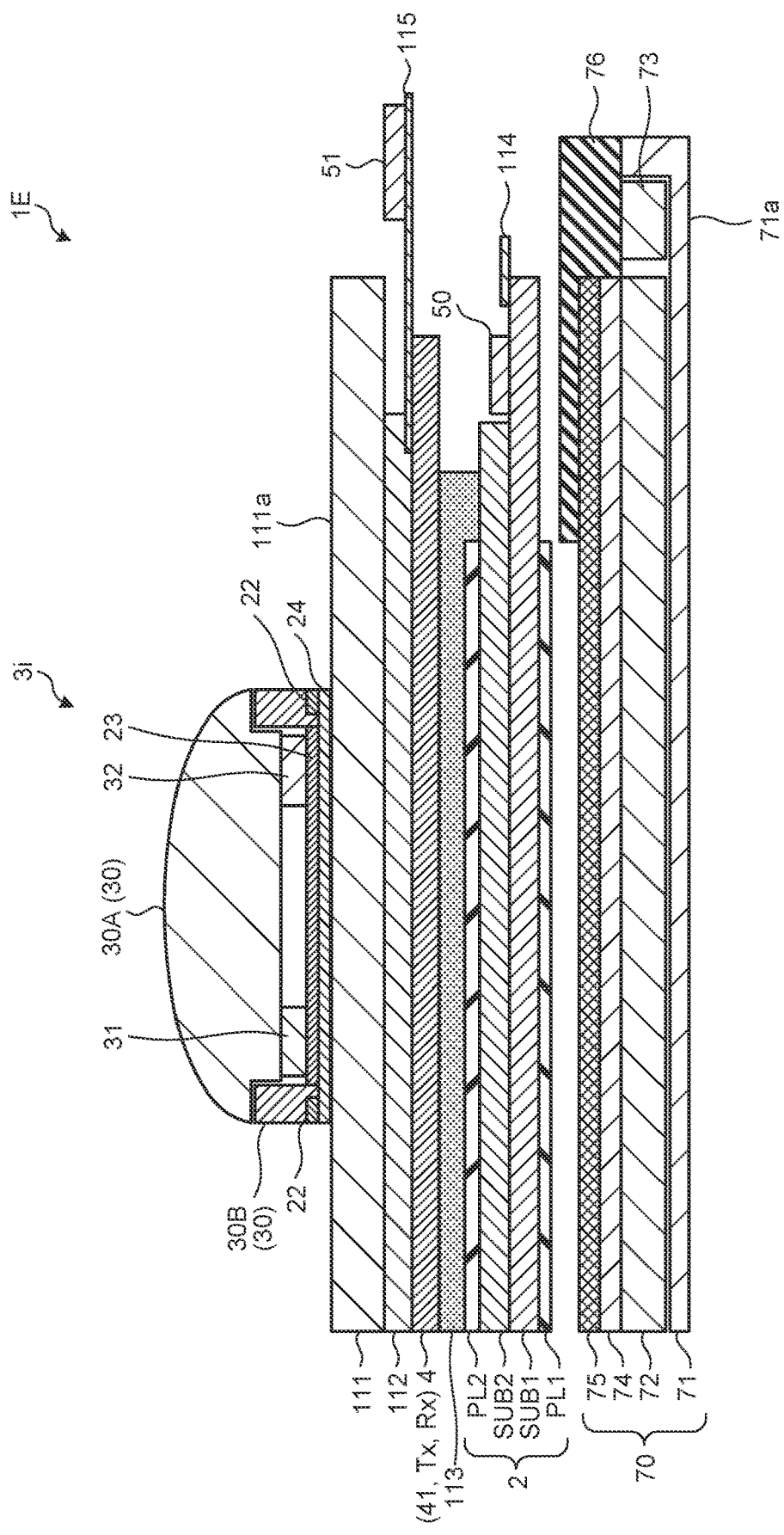
FIG. 26 is a cross-sectional view schematically illustrating an input detection system according to an eighth modification of the seventh embodiment.

FIG. 26 is a cross-sectional view schematically illustrating an input detection system according to an eighth modification of the seventh embodiment. As illustrated in FIG. 26, an input detection system 1E according to the eighth modification of the seventh embodiment is different in the configuration in which the detection device 4 is provided above the display device 2 as compared with the above-mentioned seventh modification of the seventh embodiment. Also in the present modification, the input support device 3*i* is fixed above the cover member 111 with the adhesive sheet 24, similarly to the seventh modification of the seventh embodiment.

The configurations described in the seventh embodiment and sixth modification to eighth modification can be appropriately combined with the above-mentioned first embodiment to sixth embodiment and modifications.

Although the preferred embodiments of the present invention have been described above, the present invention is not limited by these embodiments. Contents disclosed in the embodiments are merely examples, and various modifications can be made in a scope without departing from the gist of the present invention. Appropriate modifications in a scope without departing from the gist of the present invention naturally belong to the technical scope of the present invention. At least one of various omission, replacement, and modification of the components can be performed in a scope without departing from the gist of the embodiments and modifications described above.

What is claimed is:

1. An input support device arranged above a detection device including a plurality of electrodes, the input support device comprising:
    an LC circuit;
    a first electrode coupled to one end side of the LC circuit;
    a second electrode coupled to another end side of the LC circuit,
    an adjustment circuit coupled to the LC circuit and configured to adjust circuit characteristics of the LC circuit;
    a support body provided above a cover member that is provided above the detection device; and
    a rotating body provided on the support body in a rotatable manner,
    wherein
    the first electrode and the second electrode are arranged on opposite sides with respect to a rotating axis in a plan view, allowing the first electrode and the second electrode to rotate together around the rotating axis, and
    the detection device detects a position of the input support device in a plane and a rotation operation centered on the rotating axis, the LC circuit includes a first LC circuit and a second LC circuit,
the first LC circuit and the second LC circuit are arranged in parallel between the first electrode having a curved shape and the second electrode having a circular shape,
a plurality of adjustment circuits include a first adjustment circuit and a second adjustment circuit,
the first adjustment circuit includes:
  a first switch element configured to switch a coupling state between the first LC circuit and the first electrode that has a curved shape; and
  a second switch element configured to switch a coupling state between the second LC circuit and the first electrode that has a curved shape, and
the second adjustment circuit includes:
  a third switch element configured to switch a coupling state between the first LC circuit and the second electrode that has a circular shape; and
  a fourth switch element configured to switch a coupling state between the second LC circuit and the second electrode that has the circular shape.

2. The input support device according to claim 1, wherein when the first switch element and the third switch are in an ON state, the first LC circuit is coupled between the first electrode having the curved shape and the second electrode having the circular shape, and
when the second switch element and the fourth switch are in an ON state, the second LC circuit is coupled between the first electrode having the curved shape and the second electrode having the circular shape.

3. The input support device according to claim 1, wherein the first electrode and the second electrode have different shapes in a plan view.

4. The input support device according to claim 1, wherein the first electrode has the curved shape curved along a circular arc.

5. An input detection system comprising:
a detection device including a plurality of electrodes;
an input support device arranged above the detection device, the input support device comprising:
  an LC circuit;
  a first electrode coupled to one end side of the LC circuit;
  a second electrode coupled to another end side of the LC circuit,
  an adjustment circuit coupled to the LC circuit and configured to adjust circuit characteristics of the LC circuit;
  a support body provided above a cover member that is provided above the detection device; and
  a rotating body provided on the support body in a rotatable manner,
a display device;
a backlight member; and
a ferromagnetic member facing the cover member with the detection device interposed, wherein
the first electrode and the second electrode are arranged on opposite sides with respect to a rotating axis in a plan view, allowing the first electrode and the second electrode to rotate together around the rotating axis, and
  the detection device detects a position of the input support device in a plane and a rotation operation centered on the rotating axis,
  the LC circuit includes a first LC circuit and a second LC circuit,
  the first LC circuit and the second LC circuit are arranged in parallel between the first electrode having a curved shape and the second electrode having a circular shape,
a magnet is provided in the support body of the input support device, and
the display device, the backlight, and the cover member are arranged between the ferromagnetic member and the magnet provided in the support body.

6. An input detection system comprising:
the input support device according to claim 1;
a detection device including a plurality of electrodes; and
an adhesive sheet provided above the cover member, wherein the support body is fixed above the adhesive sheet.

7. An input detection system according to claim 5, wherein the ferromagnetic member is provided so as to overlap an entire surface of display device.

* * * * *